United States Patent [19]

Koshimura et al.

[11] Patent Number: 6,140,017
[45] Date of Patent: Oct. 31, 2000

[54] WATER-DEVELOPABLE PHOTOSENSITIVE RESIN COMPOSITION

[75] Inventors: Katsuo Koshimura; Tadaaki Tanaka; Noboru Shimada; Kenji Yasuda, all of Tokyo, Japan

[73] Assignee: JSR Corporation, Tokyo, Japan

[21] Appl. No.: 09/037,538

[22] Filed: Mar. 10, 1998

[30] Foreign Application Priority Data

Mar. 11, 1997 [JP] Japan ..................................... 9-072830
Mar. 13, 1997 [JP] Japan ..................................... 9-076717

[51] Int. Cl.$^7$ ...................................................... G03C 1/73
[52] U.S. Cl. .................................... 430/286.1; 430/287.1; 430/280.1; 430/283.1; 430/285.1; 430/906; 430/907
[58] Field of Search .............................. 430/280.1, 286.1, 430/287.1, 906, 907, 283.1, 285.1; 522/110

[56] References Cited

U.S. PATENT DOCUMENTS

| | | | |
|---|---|---|---|
| 5,262,228 | 11/1993 | Kohyama et al. | 428/220 |
| 5,344,744 | 9/1994 | Ueda et al. | 430/287.1 |
| 5,698,361 | 12/1997 | Aoshima | 430/906 |
| 5,731,128 | 3/1998 | Kanda et al. | 430/281.1 |
| 5,731,129 | 3/1998 | Koshimura et al. | 430/286.1 |
| 5,736,298 | 4/1998 | Koshimura et al. | 430/287.1 |

FOREIGN PATENT DOCUMENTS

| | | |
|---|---|---|
| 7-114184 | 5/1995 | Japan . |
| 8-320561 | 12/1996 | Japan . |
| 9-40728 | 2/1997 | Japan . |

*Primary Examiner*—Janet Baxter
*Assistant Examiner*—Sin J. Lee
*Attorney, Agent, or Firm*—Oblon, Spivak, McClelland, Maier & Neustadt, P.C.

[57] ABSTRACT

A water-developable photosensitive resin composition which comprises:

(1) a particulate copolymer comprising, as recurring units in the copolymer, (a) 10 to 95 mole % of an aliphatic conjugated diene unit, (b) 0.1 to 30 mole % of a monomer unit having at least one polymerizable unsaturated group and at least one functional group selected from the group consisting of carboxyl group, amino group, hydroxyl group, epoxy group, sulfonic acid group and phosphoric acid group, and (c) 0.1 to 20 mole % of a monomer unit having at least two polymerizable unsaturated groups;

(2) at least one copolymer selected from the group consisting of (i) a block-like copolymer composed of two or more polymeric segments having a sulfonic acid group in at least one of the polymeric segments, (ii) a block-like copolymer composed of two or more polymeric segments having a polyurethane segment in at least one of the polymeric segments, and (iii) a copolymer of ethylene and an α-olefin having 3 to 20 carbon atoms;

(3) a photopolymerizable unsaturated compound; and (4) a photopolymerization initiator.

16 Claims, No Drawings

WATER-DEVELOPABLE PHOTOSENSITIVE RESIN COMPOSITION

BACKGROUND OF THE INVENTION

This invention relates to a water-developable photosensitive resin composition, more particularly to a water-developable photosensitive resin composition which is small in swelling with water, small in deterioration of physical properties and small in dimensional change.

Photosensitive resin compositions have heretofore been widely used in photoresists, inks, printing plates and the like. However, in the case of most of photoresists and printing plates, organic solvents are used during development. Recently, however, in addition to problems of safety and health during working, the influence of the organic solvents on environment has become a problem. Therefore, a photosensitive resin composition to which a development with water, which is safer than the organic solvents, is applicable has been desired. In order to meet such requirements, a water-developable photosensitive resin composition comprising a water-soluble polymer, for example, polyvinyl alcohol, gelatin, casein or the like as the base material has been proposed.

However, in the case of conventional water-developable photosensitive resin compositions, the affinity of the composition for water is too high, and hence, when the composition is subjected to water-development, it is swollen with water to cause deterioration of physical properties and dimensional change. As a result, there have been such problems that it brings upon deterioration of dimensional accuracy of resist, deterioration of resistance of printing plate to printing and deterioration of print quality and the like.

SUMMARY OF THE INVENTION

This invention has been made in view of such problems, and the object of the invention is to provide a photosensitive resin composition which has a water-developability notwithstanding it is small in swelling with water and small in deterioration of physical properties and small in dimensional change.

According to this invention, there is provided a water-developable photosensitive resin composition, which comprises:

(1) a particulate copolymer comprising, as the recurring units in the copolymer:
  (a) 10 to 95 mole % of an aliphatic conjugated diene unit,
  (b) 0.1 to 30 mole % of a monomer unit having one polymerizable unsaturated group and at least one functional group selected from the group consisting of carboxyl group, amino group, hydroxyl group, epoxy group, sulfonic acid group and phosphoric acid group, and
  (c) 0.1 to 20 mole % of a monomer unit having at least two polymerizable unsaturated groups;
(2) at least one copolymer selected from the group consisting of:
  (i) a block-like copolymer composed of two or more polymeric segments and having a sulfonic acid group in at least one of the polymeric segments,
  (ii) a block-like copolymer composed of two or more polymeric segments and having a polyurethane segment in at least one of the polymeric segments, and
  (iii) a copolymer of ethylene and an α-olefin having 3 to 20 carbon atoms;

(3) a photopolymerizable unsaturated compound; and
(4) a photopolymerization initiator.

Each of the terms "carboxyl group", "sulfonic acid group" and "phosphoric acid group" used herein means a generic name including the respective free acid group and its salts.

DETAILED DESCRIPTION OF THE INVENTION

The modes for carrying out this invention are explained in detail below.

Component (1)

The component (1) which is one of the constituents of the water-developable photosensitive resin composition of this invention is a particulate copolymer comprising, as the recurring units in the copolymer, (a) 10 to 95 mole % of an aliphatic conjugated diene unit, (b) 0.1 to 30 mole % of a monomer unit having one polymerizable unsaturated group and at least one functional group selected from the group consisting of carboxyl group, amino group, hydroxyl group, epoxy group, sulfonic acid group and phosphoric acid group, and (c) 0.1 to 20 mole % of a monomer unit having at least two polymerizable unsaturated groups.

Said particulate copolymer can be produced by subjecting to emulsion polymerization or suspension polymerization a monomer mixture comprising, as the essential components, (a) an aliphatic conjugated diene [referred to hereinafter as the monomer (a)], (b) a monomer having one polymerizable unsaturated group and at least one functional group selected from the group consisting of carboxyl group, amino group, hydroxyl group, epoxy group, sulfonic acid group and phosphoric acid group [referred to hereinafter as the monomer (b)], and (c) a monomer having at least two polymerizable unsaturated groups [referred to hereinafter as the monomer (c)] and, if necessary, (d) other polymerizable unsaturated monomers which are described hereinafter [referred to hereinafter as the monomer (d)].

The monomer (a) includes as its examples 1,3-butadiene, isoprene, 2,3-dimethyl-1,3-butadiene, chloroprene and the like. These monomers (a) can be used alone or in admixture of two or more.

In the recurring units in the particulate copolymer, the content of the monomer (a) unit is 10 to 95 mole %, preferably 30 to 90 mole %. When the content of the monomer (a) unit is less than 10 mole %, the strength after photocuring of the resulting composition is lowered, while when the content exceeds 95 mole %, the resulting composition is inferior in water-developability, so that these contents are not desirable.

Among the monomers (b), the monomer having a carboxyl group includes as its examples unsaturated carboxylic acids such as (meth)acrylic acid, maleic acid, fumaric acid, itaconic acid, citraconic acid, cinnamic acid and the like; free carboxyl group-containing esters, for example, monoesters of non-polymerizable polycarboxylic acids such as phthalic acid, succinic acid, adipic acid and the like with hydroxyl group-containing unsaturated compounds such as (meth)allyl alcohol, 2-hydroxyethyl (meth)acrylate and the like, etc.; salt compounds thereof; and the like. The above-mentioned monomers having a carboxyl group can be used alone or in admixture of two or more.

The monomer having an amino group is preferably that having a tertiary amino group, and includes as its examples dialkylaminoalkyl (meth)acrylates such as dimethylaminomethyl (meth)acrylate, diethylaminomethyl (meth)

acrylate, 2-dimethylaminoethyl (meth)acrylate, 2-diethylaminoethyl (meth)acrylate, 2-(di-n-propylamino) ethyl (meth)acrylate, 2-dimethylaminopropyl (meth) acrylate, 2-diethylaminopropyl (meth)acrylate, 2-(di-n-propylamino)propyl (meth)acrylate, 3-dimethylaminopropyl (meth)acrylate, 3-diethylaminopropyl (meth)acrylate, 3-(di-n-propylamino) propyl (meth)acrylate and the like; N-dialkylaminoalkyl group-containing unsaturated amides such as N-dimethylaminomethyl(meth)acrylamide, N-diethylaminomethyl(meth)acrylamide, N-(2-dimethylaminoethyl)(meth)acrylamide, N-(2-diethylaminoethyl)(meth)acrylamide, N-(2-dimethylaminopropyl)(meth)acrylamide, N-(2-diethylaminopropyl)(meth)acrylamide, N-(3-dimethylaminopropyl)(meth)acrylamide, N-(3-diethylaminopropyl)(meth)acrylamide and the like; tertiary amino group-containing vinyl aromatic compounds such as N,N-dimethyl-p-aminostyrene, N,N-diethyl-p-aminostyrene, vinylpyridine and the like; etc. The above-mentioned monomers having an amino group can be used alone or in admixture of two or more.

Moreover, the monomer having a hydroxyl group includes as its examples hydroxyalkyl (meth)acrylates such as 2-hydroxyethyl (meth)acrylate, 2-hydroxypropyl (meth) acrylate, 3-hydroxypropyl (meth)acrylate, 2-hydroxybutyl (meth)acrylate, 3-hydroxybutyl (meth)acrylate, 4-hydroxybutyl (meth)acrylate and the like; mono(meth) acrylates of polyalkylene glycols (the number of alkylene glycol units is, for example, 2 to 23) such as polyethylene glycol, polypropylene glycol and the like; hydroxyl group-containing unsaturated amides such as N-hydroxymethyl (meth)acrylamide, N-(2-hydroxyethyl)(meth)acrylamide, N,N-bis(2-hydroxyethyl)(meth)acrylamide and the like; hydroxyl group-containing vinyl aromatic compounds such as o-hydroxystyrene, m-hydroxystyrene, p-hydroxystyrene, o-hydroxy-α-methylstyrene, m-hydroxy-α-methylstyrene, p-hydroxy-α-methylstyrene, p-vinylbenzyl alcohol and the like; (meth)allyl alcohol; and the like. The above-mentioned monomers having a hydroxyl group can be used alone or in admixture of two or more.

Furthermore, the monomer having an epoxy group includes as its examples (meth)allyl glycidyl ether, glycidyl (meth)acrylate, 3,4-oxycyclohexyl (meth)acrylate and the like. The above-mentioned monomers having an epoxy group can be used alone or in admixture of two or more.

Also, the monomer having a sulfonic acid group includes as its examples (meth)acrylamide type monomers such as 2-(meth)acrylamidoethanesulfonic acid, 2-(meth) acrylamidopropanesulfonic acid, 3-(meth) acrylamidopropanesulfonic acid, 2-(meth)acrylamido-2-methylpropanesulfonic acid, 3-(meth)acrylamido-2-methylpropanesulfonic acid and the like; (meth)acrylate type monomers such as 2-sulfoethyl (meth)acrylate, 2-sulfopropyl (meth)acrylate, 3-sulfopropyl (meth)acrylate, 1,1-dimethyl-2-sulfoethyl (meth)acrylate and the like; vinyl aromatic compound type monomers such as p-vinylbenzenesulfonic acid, p-isopropenylbenzenesulfonic acid and the like; and salt compounds thereof; etc. The above-mentioned monomers having a sulfonic acid group can be used alone or in admixture of two or more.

In addition, the monomer having a phosphoric acid group includes as its examples ethylene (meth)acrylate phosphate, trimethylene (meth)acrylate phosphate, tetramethylene (meth)acrylate phosphate, propylene(meth)acrylate phosphate, bis[ethylene (meth)acrylate] phosphate, bis [trimethylene (meth)acrylate] phosphate, bis[tetramethylene (meth)acrylate] phosphate, diethylene glycol (meth)acrylate phosphate, triethylene glycol (meth)acrylate phosphate, polyethylene glycol (meth)acrylate phosphate, bis [diethylene glycol (meth)acrylate] phosphate, bis [triethylene glycol (meth)acrylate] phosphate and bis [polyethylene glycol (meth)acrylate] phosphate; salt compounds thereof; and the like. The above-mentioned monomers having a phosphoric acid group can be used alone or in admixture of two or more.

The above-mentioned monomers (b) can be arbitrarily selected depending upon the purpose of use of the water-developable photosensitive resin composition: however, from the viewpoint that the characteristics of the composition obtained can be easily controlled in a broad range, it is preferable to use, as the monomer (b), those having at least one functional group selected from the group consisting of carboxyl group, amino group, hydroxyl group and sulfonic acid group.

In the recurring units in the particulate copolymer, the content of the monomer (b) unit is 0.1 to 30 mole %, preferably 0.5 to 20 mole %. When the content of the monomer (b) unit is less than 0.1 mole %, the water-developability of the composition obtained is poor, while when the content exceeds 30 mole %, the composition obtained becomes hard and brittle, so that these contents are not desirable.

The monomer (c) includes as its examples ethylene glycol di(meth)acrylate, propylene glycol di(meth)acrylate, 1,4-butanediol di(meth)acrylate, 1,6-hexanediol di(methacrylate), trimethylolpropane di(meth)acrylate, trimethylolpropane tri(meth)acrylate, pentaerythritol tri(meth) acrylate, pentaerythritol tetra(meth)acrylate, divinylbenzene, diisopropenylbenzene, trivinylbenzene and the like. The above-mentioned monomers (c) can be used alone or in admixture of two or more.

In the recurring units in the particulate copolymer (1), the content of the monomer (c) unit is 0.1 to 20 mole %, preferably 0.5 to 10 mole %. When the content of the monomer (c) unit is less than 0.1 mole %, the composition obtained is inferior in water-developability, while when the content exceeds 20 mole %, the compatibility between the particulate copolymer and the photopolymerizable unsaturated monomer (3) is reduced, so that the processability of the composition is impaired and the reduction of strength after photo-curing of the composition becomes remarkable, and hence, these contents are not desirable.

The monomer (d) is not critical as far as it is a compound having one copolymerizable unsaturated group, and includes as its examples styrene, α-methylstyrene, o-vinyltoluene, m-vinyltoluene, p-vinyltoluene, (meth)acrylonitrile, vinylidene cyanide, vinyl chloride, vinylidene chloride, (meth)acrylamide, maleimide, methyl (meth)acrylate, ethyl (meth)acrylate, n-propyl (meth)acrylate, i-propyl (meth) acrylate, n-butyl (meth)acrylate, i-butyl (meth)acrylate, sec-butyl (meth)acrylate, t-butyl (meth)acrylate, n-amyl (meth) acrylate, n-hexyl (meth)acrylate, 2-ethylhexyl (meth) acrylate, cyclohexyl (meth)acrylate and the like. The above-mentioned monomers (d) can be used alone or in admixture of two or more.

The particulate copolymer (1) can be produced by an emulsion polymerization method or a suspension polymerization method in which a radical initiator is used; however, it is desirable to produce the same by the emulsion polymerization method in view of the size of particles and the uniformity of particle sizes.

The radical initiator includes as its examples organic peroxides such as benzoyl peroxide, lauroyl peroxide, t-butyl hydroperoxide, cumene hydroperoxide, paramenthane hydroperoxide, di-t-butyl peroxide, dicumyl peroxide and the like; diazo compounds, a representative of which is azobisiosbutyronitrile; inorganic peroxides, a representative of which is potassium persulfate; redox type catalysts, a representative of which is a combination of one of these peroxides with ferrous sulfate; and the like. The above-mentioned radical initiators can be used alone or in admixture of two or more.

The emulsifier which may be used in the emulsion polymerization includes as its examples anionic surfactants, nonionic surfactants, cationic surfactants, amphoteric surfactants and the like, and these surfactants may be fluorine-containing surfactants. The above-mentioned emulsifiers can be used alone or in admixture of two or more.

The suspension-stabilizer which may be used in the suspension polymerization includes as its examples polyvinyl alcohol, sodium polyacrylate, hydroxyethyl cellulose and the like. The above-mentioned suspension-stabilizers can be used alone or in admixture of two or more.

In the emulsion polymerization or suspension polymerization, each monomer and a polymerization reagent such as radical initiator or the like may be added in such a manner that all the amount is added at one time at the start of reaction or may be added continuously or stepwise after the start of reaction. The polymerization is conducted in an oxygen-freed reactor at a temperature of 0 to 80° C.; however, operation conditions such as temperature, stirring speed and the like can be appropriately varied in the middle of the reaction. The polymerization system may be either continuous system or batchwise system.

By making the surface of particle of the particulate copolymer (1) hydrophilic and making the interior of particle of the particulate copolymer (1) hydrophobic, the water resistance and water-developability of the water-developable photosensitive resin composition can be further enhanced. The average particle size of the particulate copolymer (1) is 0.02 to 1 μm.

(2) Copolymers [the Component (2)]

The component (2) which is one of the constituents of the water-developable photosensitive resin composition of this invention is at least one copolymer selected from the group consisting of (i) a block-like copolymer composed of two or more polymeric segments and having a sulfonic acid group in at least one of the polymeric segments [referred to hereinafter merely as the block-like copolymer (i)], (ii) a block-like copolymer composed of two or more polymeric segments and having a polyurethane segment in at least one of the polymeric segments [referred to hereinafter merely as the block-like copolymer (ii)] and (iii) a copolymer of ethylene and an α-olefin having 3 to 20 carbon atoms (referred to hereinafter merely as the α-olefin) [the copolymer is hereinafter referred to merely as the ethylene-α-olefin copolymer (iii)].

Each of the copolymers included in the component (2) is successively explained below.

First of all, in the block-like copolymer (i), the monomer component constituting the polymeric segment having a sulfonic acid group [referred to hereinafter as the monomer component (a')] is not critical, and can be appropriately selected from vinyl aromatic compounds, aliphatic conjugated diene compounds, (meth)acrylic ester compounds and other polymerizable unsaturated compounds.

The above vinyl aromatic compound includes as its examples styrene, α-methylstyrene, p-vinyltoluene, p-t-butylstyrene, m-methoxystyrene, p-methoxystyrene, divinylbenzene, m-chlorostyrene, p-chlorostyrene, N,N-dimethyl-p-aminostyrene, vinylpyridine, o-hydroxystyrene, m-hydroxystyrene, p-hydroxystyrene, o-hydroxy-α-methylstyrene, m-hydroxy-α-methylstyrene, p-hydroxy-α-methylstyrene, p-vinylbenzyl alcohol and the like, and particularly preferable are styrene, α-methylstyrene, o-vinyltoluene, m-vinyltoluene, p-vinyltoluene, p-t-butylstyrene and o-methoxystyrene.

The above aliphatic conjugated diene compound includes as its examples 1,3-butadiene, isoprene, 2,3-dimethyl-1,3-butadiene, 1,3-pentadiene, 2-methyl-1,3-pentadiene, chloroprene and the like, and in order to obtain a sulfonic acid group-containing block-like copolymer which can be utilized in industry and has excellent physical properties, preferable are 1,3-butadiene, isoprene and 1,3-pentadiene, and particularly preferable are 1,3-butadiene and isoprene.

The above (meth)acrylic ester compound includes as its examples alkyl (meth)acrylates such as methyl (meth)acrylate, ethyl (meth)acrylate, n-propyl (meth)acrylate, i-propyl (meth)acrylate, n-butyl (meth)acrylate, i-butyl (meth)acrylate, sec-butyl (meth)acrylate, t-butyl (meth)acrylate, n-amyl (meth)acrylate, n-hexyl (meth)acrylate, 2-ethylhexyl (meth)acrylate, n-octyl (meth)acrylate, lauryl (meth)acrylate, stearyl (meth)acrylate and the like; alkoxyalkyl (meth)acrylates such as 2-methoxyethyl (meth) acrylate, 2-ethoxyethyl (meth)acrylate, 2-methoxypropyl (meth)acrylate, 2-ethoxypropyl (meth)acrylate, 3-methoxypropyl (meth)acrylate, 3-ethoxypropyl (meth) acrylate and the like; etc.

The method of introducing a sulfonic acid group into at least one polymeric segment of the block-like copolymer (i) is not critical, and includes as its examples:

(A) a method which comprises sulfonating the polymeric segment having a carbon-to-carbon double bond in the polymer side chain and/or the polymer main chain with a known sulfonating agent such as sulfuric anhydride, fuming sulfuric acid, chlorosulfonic acid, sodium hydrogensulfite or the like under the known conditions and thereafter, if necessary, allowing water or a basic compound to act thereon to introduce a sulfonic acid (salt) group;

(B) a method for copolymerizing a polymerizable unsaturated monomer component having a sulfonic acid group in the side chain (referred to hereinafter as the sulfonic acid group-containing monomer component), for example, a vinyl group-containing sulfonic acid (salt) such as styrene-sulfonic acid or the like, (meth)allyl group-containing sulfonic acid (salt), (meth)acryloyl group-containing sulfonic acid (salt), or the like, with the monomer component (a') in a known manner; and the like.

The content of the sulfonic acid group in the polymeric segment having introduced thereinto a sulfonic acid group is usually 0.5 to 6.0 millimoles/g, preferably 3.0 to 5.8 millimoles/g, in terms of $SO_3H$. When the content of the sulfonic acid group is less than 0.5 millimole/g, the water-developability of the composition obtained tends to become low, while when the content exceeds 6.0 millimoles/g, the fluidity of the composition obtained tends to be lowered and the kneading processability tends to become low.

The block-like copolymer (i) in this invention is composed of two or more polymeric segments and has a sulfonic acid group in at least one of the polymeric segments and is preferably composed of the polymeric segment A and the polymeric segment B which have different glass transition temperatures (Tg), the glass transition temperature of the polymeric segment B being lower than that of the polymeric segment A. It is preferable that the Tg of one of the polymeric segments A and B is 0° C. or higher and that of the other polymeric segment is lower than 0° C.

The Tg difference between the polymeric segment A and the polymeric segment B constituting a block-like copolymer (i) varies depending upon the kind of the monomeric component and factors concerning the structure of polymer chain such as stereostructure and the like, and is preferably not less than 10° C.

Moreover, as the structure of the block-like copolymer (i) composed of the polymeric segment A and the polymeric segment B, there can be appropriately selected an A—B diblock structure, an A—B—A triblock structure, a B—A—B triblock structure, an (A)$_n$—(B)$_m$ random block structure in which n and m are integers indicating the numbers of the polymeric segments A and the polymeric segments B, respectively, and the like depending upon the purpose.

In this invention, as the block-like copolymer (i) composed of the polymeric segment A and the polymeric segment B, from such points of view that it can be utilized in industry and can easily yield a water-developable photosensitive resin composition excellent in physical properties, it is preferable that at least 50% by weight of the constitutive monomer component of any one of the polymeric segment A and the polymeric segment B consists of a vinyl aromatic compound and at least 50% by weight of the constitutive monomer component of the other polymeric segment consists of an aliphatic conjugated diene compound, preferably the other polymeric segment being sulfonated in its constitutive portion of the aliphatic conjugated diene compound.

Furthermore, the weight ratio between the polymeric segment A and the polymeric segment B in the block-like copolymer (i) (the polymeric segment A/the polymeric segment B) is preferably 95/5 to 5/95, more preferably 80/20 to 5/95 and most preferably 70/30 to 5/95.

The process for producing the block-like copolymer is not critical, and the process for producing a block-like copolymer composed of the polymeric segment A and the polymeric segment B can be appropriately selected from the following examples:

(C) a method which comprises sulfonating a block-like copolymer consisting of two or more polymeric segments by the above-mentioned method (A) to introduce a sulfonic acid group into at least one limited polymeric segment, (D) a method which comprises separately synthesizing the polymeric segment A and the polymeric segment B and then bonding the two polymeric segments to each other by coupling reaction, (E) a method of synthesizing the polymeric segment B using a polymerization initiator having the polymeric segment A structure in the molecule, (F) a method of synthesizing the polymeric segment A using a polymerization initiator having the polymeric segment B structure in the molecule, and the like.

The block-like copolymer (2)(ii) is a block-like copolymer composed of two or more polymeric segments and having a polyurethane segment in at least one of the polymeric segments, and is preferably a block like copolymer comprising a polymeric segment selected from the group consisting of polyurea and non-polyether type polyurethane and a polymeric segment selected from the group consisting of polyether type polyurethane, dimethylpolysiloxane and vinyl type and/or conjugated diene type block (co)polymer.

Specifically, the block-like copolymer (2)(ii) is a block-like copolymer comprising at least one polymeric segment represented by the general formula (I):

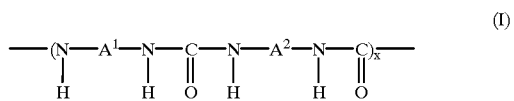

wherein each of $A^1$ and $A^2$ represents independently a divalent group derived from a compound selected from the group consisting of alkanes having 1 to 12 carbon atoms, benzene, methylbenzene, dimethylbenzene, naphthalene, diphenyl, dimethyldiphenyl, dimethoxydiphenyl, diphenylmethane, dimethyldiphenylmethane, cyclohexane, isophorone and dicyclohexylmethane, and X is an integer of 2 to 100, or the general formula (II):

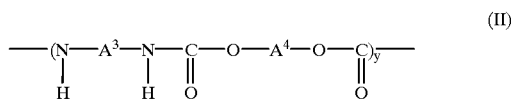

wherein each of $A^3$ and A4 represents independently a divalent group derived from a compound selected from the group consisting of alkanes having 1 to 12 carbon atoms, benzene, methylbenzene, dimethylbenzene, naphthalene, diphenyl, dimethyldiphenyl, dimethoxydiphenyl, diphenylmethane, dimethyldiphenylmethane, cyclohexane, isophorone and dicyclohexylmethane, and Y is an integer of 2 to 100, and at least one polymeric segment represented by the general formula (III):

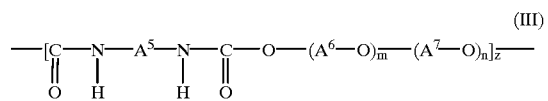

wherein $A^5$ represents a divalent group derived from a compound selected from the group consisting of alkanes having 1 to 12 carbon atoms, benzene, methylbenzene, dimethylbenzene, naphthalene, diphenyl, dimethyldiphenyl, dimethoxydiphenyl, diphenylmethane, dimethyldiphenylmethane, cyclohexane, isophorone and dicyclohexylmethane; $A^6$ represents a divalent group derived from a compound selected from the group consisting of alkanes having 1 to 12 carbon atoms, halogenated alkanes having 1 to 12 carbon atoms, benzene, methylbenzene, dimethylbenzene, naphthalene, diphenyl, dimethyldiphenyl, dimethoxydiphenyl, diphenylmethane, dimethyldiphenylmethane, cyclohexane, isophorone and dicyclohexylmethane, or a group represented by the formula —$A^8$—CO— in which $A^8$ represents an alkylene group having 1 to 12 carbon atoms; $A^7$ represents a divalent group derived from a compound selected from the group consisting of alkanes having 1 to 12 carbon atoms, halogenated alkanes having 1 to 12 carbon atoms, benzene, methylbenzene, dimethylbenzene, naphthalene, diphenyl, dimethyldiphenyl, dimethoxydiphenyl, diphenylmethane, dimethyldiphenylmethane, cyclohexane, isophorone and dicyclohexylmethane or a group represented by the formula —$A^8$—CO— in which $A^8$ represents an alkylene group having 1 to 12 carbon atoms or by the formula —NH—$A^9$—CO— in which $A^9$ represents an alkylene group having 1 to 12 carbon atoms; m is an integer of 1 to 100; n is an integer of 0 to 100, provided m+n≧2; and Z is an integer of 1 to 100,
or the general formula (IV):

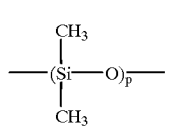

(IV)

wherein p is an integer of 2 to 100,
or the general formula (V):

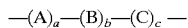

(V)

wherein A represents the residue of a vinyl aromatic compound, B represents the residue of an aliphatic conjugated diene compound, C represents the residue of a (meth) acrylic ester compound or another copolymerizable vinyl compound, and each of a, b and c represents independently an integer of 0 to 1,000,000, provided 2≦a+b+c≦3,000,000.

The methods for preparing the polymeric segment represented by the general formula (I) [referred to hereinafter as the polymeric segment (I)] and the polymeric segment represented by the general formula (II) [referred to hereinafter as the polymeric segment (II)] are not critical, and the polymeric segment (I) can be obtained by, for example, chain-extending a diisocyanate compound with a diamine by a conventional method, and the polymeric segment (II) can be obtained by, for example, chain-extending a diisocyanate compound with a dihydroxy compound by a conventional method.

Specific examples of the above-mentioned diisocyanate compound include:
alkylene diisocyanates such as methylene diisocyanate, ethylene diisocyanate, propylene diisocyanate, methylethylene diisocyanate, butylene diisocyanate, ethylethylene diisocyanate, pentamethylene diisocyanate, 2-methylbutylene diisocyanate, 1,2-dimethylpropylene diisocyanate, 2-ethylpropylene diisocyanate, propylethylene diisocyanate, hexamethylene diisocyanate, 2-methylpentylene diisocyanate, heptamethylene diisocyanate, octamethylene diisocyanate, nonamethylene diisocyanate, decamethylene diisocyanate, undecamethylene diisocyanate, dodecamethylene diisocyanate and the like; aromatic diisocyanates such as 1,3-phenylene diisocyanate, 1,4-phenylene diisocyanate, 2,4-toluene diisocyanate, 2,6-toluene diisocyanate, 4,5-dimethyl-1,3-phenylene diisocyanate, 4,6-dimethyl-1,3-phenylene diisocyanate, 2,5-dimethyl-1,4-phenylene diisocyanate, 2,6-dimethyl-1,4-phenylene diisocyanate, 1,4-naphthalene diisocyanate, 1,5-naphthalene diisocyanate, 4,4'-diphenyl diisocyanate, 3,3'-dimethyl-4,4'-diphenyl diisocyanate, 3,3'-dimethoxy-4,4'-diphenyl diisocyanate, 4,4'-diphenylmethane diisocyanate, 3,3'-dimethyl-4,4'-diphenylmethane diisocyanate and the like; alicyclic diisocyanates such as 1,3-cyclohexylene diisocyanate, 1,4-cyclohexylene diisocyanate, 1,5-isophorone diisocyanate, 4,4'-dicyclohexyl diisocyanate, 4,4'-dicyclohexylmethane diisocyanate and the like; etc.

Among these diisocyanates, preferable are 1,3-phenylene diisocyanate, 1,4-phenylene diisocyanate, 2,4-toluene diisocyanate, 2,6-toluene diisocyanate, 1,5-naphthalene diisocyanate, 4,4'-diphenyl diisocyanate, 3,3'-dimethyl-4,4'-diphenyl diisocyanate, 4,4'-diphenylmethane diisocyanate, 1,5-isophorone diisocyanate and 4,4'-dicyclohexyl diisocyanate, and particularly preferable are 1,3-phenylene diisocyanate, 1,4-phenylene diisocyanate, 2,4-toluene diisocyanate, 2,6-toluene diisocyanate, 4,4'-diphenylmethane diisocyanate, 3,3'-dimethyl-4,4'-diphenyl diisocyanate, 1,5-isophorone diisocyanate and 4,4'-dicyclohexyl diisocyanate.

The above-mentioned diisocyanate compounds can be used alone or in admixture of two or more.

Moreover, specific examples of the above-mentioned diamine compound include:
alkylenediamines such as ethylenediamine, propylenediamine, butylenediamine, pentamethylenediamine, hexamethylenediamine, heptamethylenediamine, octamethylenediamine, nonamethylenediamine, decamethylenediamine, undecamethylenediamine, dodecamethylenediamine and the like;
aromatic diamines such as 1,3-phenylenediamine, 1,4-phenylenediamine, 2,4-toluenediamine, 2,6-toluenediamine, 4,5-dimethyl-1,3-phenylenediamine, 4,6-dimethyl-1,3-phenylenediamine, 2,5-dimethyl-1,4-phenylenediamine, 2,6-dimethyl-1,4-phenylenediamine, 1,4-naphthalenediamine, 1,5-naphthalenediamine, 4,4'-diphenyldiamine, 3,3'-dimethyl-4,4'-diphenyldiamine, 3,3'-dimethoxy-4,4'-diphenyldiamine, 4,4'-diphenylmethanediamine, 3,3'-dimethyl-4,4'-diphenylmethanediamine and the like;
alicyclic diamines such as 1,3-cyclohexylenediamine, 1,4-cyclohexylenediamine, 1,5-isophoronediamine, 4,4'-dicyclohexyldiamine, 4,4'-dicyclohexylmethanediamine and the like; etc.

Among these diamine compounds, preferable are ethylenediamine, propylenediamine, 1,3-phenylenediamine, 1,4-phenylenediamine, 2,4-toluenediamine, 2,6-toluenediamine, 4,4'-diphenyldiamine, 3,3'-dimethyl-4,4'-diphenyldiamine, 3,3'-dimethoxy-4,4'-diphenyldiamine, 4,4'-diphenylmethanediamine, 1,3-cyclohexylenediamine and 1,4-cyclohexylenediamine, and particularly preferable are ethylenediamine, 1,3-phenylenediamine, 1,4-phenylenediamine, 4,4'-diphenyldiamine, 3,3'-dimethyl-4, 4'-diphenyldiamine, 3,3'-dimethoxy-4,4'-diphenyldiamine, 4,4'-diphenylmethanediamine, 1,3-cyclohexylenediamine and 1,4-cyclohexylenediamine.

The above-mentioned diamine compounds can be used alone or in admixture of two or more.

Furthermore, specific examples of the above-mentioned dihydroxy compound includes:
alkanediols such as 1,2-ethanediol, 1,2-propanediol, 1,3-propanediol, 1,2,3-propanetriol, 1,2-butanediol, 1,3-butanediol, 1,4-butanediol, 1,2,3-butanetriol, 1,2,4-butanetriol, 1,3,4-butanetriol, 1,2-pentanediol, 1,3-pentanediol, 1,4-pentanediol, 1,5-pentanediol, 1,2-hexanediol, 1,3-hexanediol, 1,4-hexanediol, 1,5-hexanediol, 1,6-hexanediol, 1,7-heptanediol, 1,8-octanediol, 1,9-nonanediol, 1,10-decanediol, 1,11-undecanediol, 1,12-dodecanediol and the like;
aromatic dihydroxy compounds such as 1,3-dihydroxybenzene, 1,4-dihydroxybenzene, 2,4-dihydroxytoluene, 2,6-dihydroxytoluene, 4,5-dimethyl-1,3-dihydroxybenzene, 4,6-dimethyl-1,3-dihydroxybenzene, 2,5-dimethyl-1,4-dihydroxybenzene, 2,6-dimethyl-1,4-dihydroxybenzene, 1,4-dihydroxynaphthalene, 1,5-dihydroxynaphthalene, 4,4'-dihydroxydiphenyl, 3,3'-dimethyl-4,4'-dihydroxydiphenyl, 3,3'-dimethoxy-4,4'-dihydroxydiphenyl, 4,4'-dihydroxydiphenylmethane, 3,3'-dimethyl-4,4'-dihydroxydiphenylmethane and the like; and alicyclic dihydroxy compounds such as 1,3-dihydroxycyclohexane, 1,4-dihydroxycyclohexane, 1,5-dihydroxyisophorone, 4,4'-dihydroxydicyclohexyl, 4,4'-dihydroxydicyclohexylmethane and the like.

Among these dihydroxy compounds, preferable are 1,2-ethanediol, 1,3-propanediol, 1,3-pentanediol, 1,4-pentanediol, 1,6-hexanediol, 1,9-nonanediol, 4,4'-dihydroxydiphenyl, 3,3'-dimethyl-4,4'-dihydroxydiphenyl, 3,3'-dimethoxy-4,4'-dihydroxydiphenyl and 1,5-dihydroxyisophorone, and particularly preferable are 1,2-ethanediol, 1,3-propanediol, 1,4-pentanediol, 1,6-hexanediol and 1,9-nonanediol.

The above-mentioned dihydroxy compounds can be used alone or in admixture of two or more.

Moreover, in the general formula (I) and the general formula (II), X and Y are preferably 3 to 90.

Next, an explanation is made of the polymeric segment represented by the general formula (III) [referred to hereinafter as the polymeric segment (III)], the polymeric segment represented by the general formula (IV) [referred to hereinafter as the polymeric segment (IV)] and the polymeric segment represented by the general formula (V) [referred to hereinafter as the polymeric segment (V)] in this order.

The method of preparing the polymeric segment (III) is not critical, and it can be obtained by subjecting a diisocyanate compound to chain-extension in a conventional manner with at least one polymer having hydroxyl groups at both terminals (provided at least dimer) obtained according to an established method such as polycondensation of dihydroxy compound; ring-opening polymerization of cyclic ether compound or cyclic ester compound; polymerization of carbonyl compound; or the like.

Specific examples of the above-mentioned diisocyanate compound include the same diisocyanate compounds as mentioned as to the above polymeric segment (I) and the above polymeric segment (II).

Among these isocyanate compounds, preferable are 1,3-phenylene diisocyanate, 1,4-phenylene diisocyanate, 2,4-toluene diisocyanate, 2,6-toluene diisocyanate, 1,5-naphthalene diisocyanate, 4,4'-diphenyl diisocyanate, 3,3'-dimethyl-4,4'-diphenyl diisocyanate, 4,4'-diphenylmethane diisocyanate, 1,5-isophorone diisocyanate and 4,4'-dicyclohexyl diisocyanate, and particularly preferable are 1,3-phenylene diisocyanate, 1,4-phenylene diisocyanate, 2,4-toluene diisocyanate, 2,6-toluene diisocyanate, 4,4'-diphenylmethane diisocyanate, 3,3'-dimethyl-4,4'-diphenyl diisocyanate, 1,5-isophorone diisocyanate and 4,4'-dicyclohexyl diisocyanate.

The above-mentioned diisocyanate compounds can be used alone or in admixture of two or more.

Furthermore, specific examples of the above-mentioned dihydroxy compound include the same compounds as mentioned as to the above polymeric segment (II); halogenated (the halogen: F, Cl, Br, I or the like) derivatives of these compounds; and the like.

Among these dihydroxy compounds, preferable are 1,2-ethanediol, 1,3-propanediol, 1,3-pentanediol, 1,4-pentanediol, 1,6-hexanediol, 1,9-nonanediol, 4,4'-dihydroxydiphenyl, 3,3'-dimethyl-4,4'-dihydroxydiphenyl, 3,3'-dimethoxy-4,4'-dihydroxydiphenyl and 1,5-dihydroxyisophorone, and particularly preferable are 1,2-ethanediol, 1,3-propanediol, 1,4-pentanediol, 1,6-hexanediol and 1,9-nonanediol.

The above-mentioned dihydroxy compounds can be used alone or in admixture of two or more.

Specific examples of the above-mentioned cyclic ether compound include three-membered cyclic ethers such as ethylene oxide, propylene oxide, styrene oxide, phenyl glycidyl ether and the like; four-membered cyclic ethers such as 3,3-bis(chloromethyl)oxetane and the like; five-membered cyclic ethers such as tetrahydrofuran and the like; 1,3,5-trioxane; cyclic formals; halogenated (the halogen: F, Cl, Br, I or the like) derivatives of these compounds; and the like.

Among these cyclic ether compounds, preferable are ethylene oxide, propylene oxide, styrene oxide, tetrahydrofuran and 1,3,5-trioxane, and particularly preferable are ethylene oxide, propylene oxide, tetrahydrofuran and 1,3,5-trioxane.

The above-mentioned cyclic ether compounds can be used alone or in admixture of two or more.

Specific examples of the above-mentioned cyclic ester compound include lactones such as β-propiolactone, γ-butyrolactone, δ-valerolactone and the like; diketenes; cyclic ketene acetals such as 1,3-dioxepane, 2-methylene-1,3-dioxepane and the like; halogenated (the halogen: F, Cl, Br, I or the like) derivatives of these compounds; and the like.

Among these cyclic ester compounds, preferable are β-propiolactone, γ-butyrolactone, 1,3-dioxepane and 2-methylene-1,3-dioxepane, and particularly preferable are γ-butyrolactone, 1,3-dioxepane, 2-methylene-1,3-dioxepane.

The above-mentioned cyclic ester compounds can be used alone or in admixture of two or more.

Specific examples of the above-mentioned carbonyl compound include formaldehyde, acetaldehyde, n-propionaldehyde, i-propionaldehyde, n-butyraldehyde, i-butyraldehyde, acroleins, halogenated acetaldehydes such as trifluoroacetaldehyde, trichloroacetaldehyde and the like, etc.

Among these carbonyl compounds, preferable are formaldehyde, acetaldehyde, n-propionaldehyde, n-butyraldehyde and i-butyraldehyde, and particularly preferable are formaldehyde, acetaldehyde and n-propionaldehyde.

The above-mentioned carbonyl compounds can be used alone or in admixture of two or more, and, if necessary, can be used in combination with a small amount of a lactam such as azetidinone, pyrrolidone, ε-caprolactam or the like. In this case, the amount of the lactam used is usually not more than 50 mole %, preferably not more than 30 mole %, based on the total amount of the carbonyl compound and the lactam.

Moreover, in the general formula (III), m is preferably 1 to 50, n is preferably 0 to 50 and Z is preferably 1 to 80.

The method of preparing the polymeric segment (IV) is not critical, and it can be obtained by subjecting a silanol compound obtained by the hydrolysis of, for example, dimethyldichlorosilane and/or a dimethyldialkoxysilane (for example, dimethyldimethoxysilane, dimethyldiethoxysilane or the like) to polycondensation in a conventional manner.

Moreover, the above-mentioned dimethyldichlorosilane and/or dimethyldialkoxysilane can be used, if necessary, in combination with another silane compound. In this case, the amount of the said other silane compound used is usually not more than 50 mole %, preferably not more than 30 mole %, based on the total amount of the dimethyldichlorosilane and/or dimethyldialkoxysilane and the said other silane compound.

As the said other silane compound, there can be used, for example, other dialkyldichlorosilanes and dialkyldialkoxysilanes than dimethyldichlorosilane and dimethyldialkoxysilanes; triorganosilhemioxanes; organosilsesquioxanes; and orthosilicates, and for some purposes, triorganochlorosilanes; siloxane compounds having a functional group or groups such as amino group, epoxy group, polymerizable unsaturated group or the like on one or both terminals of the molecular chain; and the like can be used.

Specific examples of the said other silane compound include alkylchlorosilanes such as trimethylchlorosilane, triethylchlorosilane, methyltrichlorosilane, ethyltrichlorosilane, methyldichlorosilane, ethyldichlorosilane, dimethylchlorosilane, diethylchlorosilane and the like;

phenylchlorosilanes such as triphenylchlorosilane, diphenyldichlorosilane, phenyltrichlorosilane and the like;

alkylalkoxysilanes and tetraalkoxysilanes such as trimethylmethoxysilane, trimethylethoxysilane, methyltrimethoxysilane, methyltriethoxysilane, tetramethoxysilane, tetraethoxysilane, methyldimethoxysilane, methyldiethoxysilane, dimethylmethoxysilane, dimethylethoxysilane, cyclohexyl(methyl)dimethoxysilane, n-hexyltrimethoxysilane, octadecyltrimethoxysilane, octadecyltriethoxysilane and the like;

phenylalkoxysilanes such as triphenylmethoxysilane, triphenylethoxysilane, diphenyldimethoxysilane, diphenyldiethoxysilane, phenyltrimethoxysilane, phenyltriethoxysilane and the like; etc.

In the general formula (IV), p is preferably 3 to 80.

Among the constitutive monomer components of the polymeric segment (V), the vinyl aromatic compound, the aliphatic conjugated diene compound and the (meth)acrylic ester compound include as their specific examples the respective compounds mentioned above as to the block-like copolymer (i).

In the general formula (V), a is preferably 1 to 500,000, b is preferably 1 to 500,000, c is preferably 1 to 500,000 and a+b+c is preferably 3 to 1,500,000.

As the structure of the polymeric block in the block-like copolymer (ii), there can be freely selected, depending upon the purpose, a diblock structure, a triblock structure, a random block structure or the like in which at least one member selected from the group consisting of the polymeric segment (I) and the polymeric segment (II) is combined with at least one member selected from the group consisting of the polymeric segment (III), the polymeric segment (IV) and the polymeric segment (V) so as to meet the purpose.

In the block-like copolymer (ii), the weight ratio of the polymeric segment selected from the group consisting of the polymeric segment (I) and the polymeric segment (II), to the polymeric segment selected from the group consisting of the polymeric segment (III), the polymeric segment (IV) and the polymeric segment (V) can be appropriately selected depending upon the purpose of use, and the weight ratio of the former polymeric segment to the latter polymeric segment is preferably 99/1 to 1/99, more preferably 80/20 to 5/95, and particularly preferably 70/30 to 5/95.

The process for producing the block-like copolymer (ii) is not critical, and examples thereof are the following:

(A') a process which comprises synthesizing at least one polymeric segment selected from the group consisting of the polymeric segment (I) and the polymeric segment (II) and subsequently synthesizing the polymeric segment (III), (B') a process which comprises synthesizing at least one polymeric segment selected from the group consisting of the polymeric segment (III), the polymeric segment (IV) and the polymeric segment (V) and subsequently synthesizing at least one polymeric segment selected from the group consisting of the polymeric segment (I) and the polymeric segment (II), (C') a process which comprises separately synthesizing at least one polymeric segment selected from the group consisting of the polymeric segment (I) and the polymeric segment (II), and at least one polymeric segment selected from the group consisting of the polymeric segment (III), the polymeric segment (IV) and the polymeric segment (V), and then bonding the two to each other by coupling reaction, (D') a process which comprises synthesizing at least one polymeric segment selected from the group consisting of the polymeric segment (III), the polymeric segment (IV) and the polymeric segment (V) using a polymerization initiator having in the molecule at least one polymeric segment selected from the group consisting of the polymeric segment (I) and the polymeric segment (II), (E') a process which comprises synthesizing at least one polymeric segment selected from the group consisting of the polymeric segment (I) and the polymeric segment (II) using a polymerization initiator having in the molecule at least one polymeric segment selected from the group consisting of the polymeric segment (III), the polymeric segment (IV) and the polymeric segment (V), and the like.

Among these production processes, the processes (A'), (B') and (C') are preferred from the viewpoint that the synthesis is relatively easy.

When the block-like copolymer (ii) is produced by the above process (A'), the polymeric segment (I) has isocyanate groups and/or amino groups at both terminals of the molecular chain, and the polymeric segment (II) has isocyanate groups and/or hydroxyl groups at both terminals of the molecular chain. Accordingly, when the polymeric segment (III) is synthesized in the presence of the polymeric segment (I) and/or the polymeric segment (II), the polymeric segment (III) can be bonded to the polymeric segment (I) and/or the polymeric segment (II) by the reaction between the isocyanate group and the amino group or the hydroxyl group.

Moreover, when the block-like copolymer (ii) is synthesized by the above-mentioned process (B'), the polymeric segment (III) has isocyanate groups and/or hydroxyl groups at both terminals of the molecular chain. Accordingly, when the polymeric segment (I) and/or the polymeric segment (II) are/is synthesized in the presence of the polymeric segment (III) having an isocyanate group or groups at one or more terminals of the molecular chain, the polymeric segment (I) and/or the polymeric segment (II) can be bonded to the polymeric segment (III) by the reaction between the isocyanate group and the amino group or hydroxyl group. Furthermore, when the polymeric segment (I) and/or the polymeric segment (II) are/is synthesized after the hydroxyl groups of the polymeric segment (III) having hydroxyl groups at both terminals of the molecular chain have been reacted with an excess of a diisocyanate compound to introduce the isocyanate group into the polymeric segment (III), the polymeric segment (I) and/or the polymeric segment (II) can be bonded to the polymeric segment (III) by the same reaction as mentioned above. Alternatively, when the polymeric segment (IV) and/or the polymeric segment (V) are/is previously synthesized, an isocyanate, amino or hydroxyl group is previously introduced into both terminals of each of the molecular chains of these polymeric segments and these groups are utilized to make it possible to bond the polymeric segment (I) and/or the polymeric segment (II) to the polymeric segment (IV) and/or the polymeric segment (V) by the same operation and reaction as mentioned above.

Furthermore, when the block-like copolymer (ii) is produced by the above-mentioned process (C'), the functional group or groups present at one or more terminals of each of the molecular chains of the polymeric segments are used to allow the different polymeric segments to undergo coupling reaction at the respective terminals.

Specific examples of the reaction between the functional groups in the process (C') include esterification reaction between carboxyl group and epoxy group, anhydride-formation reaction between acid chloride group and carboxyl group, amide-formation reaction between acid chloride group and amino group, amide-formation reaction between isocyanate group and carboxyl group, urethanation reaction between isocyanate group and hydroxyl group, urea-formation reaction between isocyanate group and amino group, amide-formation reaction between isocyanate group and carboxyl group or acid anhydride group, reaction between carbonyl group and alkylidenephosphorane, and the like. However, from the viewpoint of simplicity of reaction and industrial productivity, the reaction between isocyanate group and hydroxyl group or amino group is preferable. In the process (C'), only one of the above reactions may be carried out or at least two of the reactions may be carried out simultaneously.

The block-like copolymer (ii) is preferably a block-like copolymer comprising at least one polymeric segment represented by the general formula (I) or the general formula (II) and at least one polymeric segment represented by the general formula (III) or the general formula (V).

The amount of the block-like copolymer (i) or (ii) used is appropriately adjusted so as to meet the purpose; however, it is preferably 1 to 500 parts by weight, more preferably 1 to 300 parts by weight, per 100 parts by weight of the particulate copolymer (1). When the amount of the block-like copolymer used is less than 1 part by weight, the water-developability of the composition obtained tends to become low, while when the amount exceeds 500 parts by weight, the strength of the composition obtained tends to be reduced.

The ethylene-α-olefin copolymer (iii) can be produced by copolymerizing a monomeric mixture comprising ethylene and an α-olefin having 3 to 20 carbon atoms as the essential components and optionally a non-conjugated diene as mentioned hereinafter, preferably using a catalyst consisting of a vanadium compound and an organoaluminum compound.

The above α-olefin includes as its examples propylene, butene-1, pentene-1, 2-methylbutene-1, 3-methylbutene-1, hexene-1, 3-methylpentene-1, 4-methylpentene-1, 3,3-dimethylbutene-1, heptene-1, 2-methylhexene1, 4,4-dimethylpentene-1, 2,3,3-trimethylbutene-1, 3-ethylpentene-1, octene-1, 2-methylheptene-1, 4,4-dimethylhexene-1, 2,4,4-trimethylpentene-1, 4-ethylhexene-1, 3-methyl-3-ethylpentene-1, decene-1, 3-methylnonene-1, 3,7-dimethyloctene-1, 3,3,5-trimethylheptene-1, 5-ethyloctene-1, 3-methyl-5-ethylheptene-1, 3,4-diethylhexene-1, dodecene-1, tetradecene-1, hexadecene-1, octadecene-1, eicosene-1 and the like.

These α-olefins can be used alone or in admixture of two or more.

In the recurring units in the ethylene-α-olefin copolymer (iii), the content of the ethylene unit is preferably 60 to 95 mole %, more preferably 60 to 85 mole %, based on the total amount of the ethylene unit and the α-olefin unit, and the content of the α-olefin unit is preferably 5 to 40 mole %, more preferably 15 to 40 mole %, based on the total amount of the ethylene unit and the α-olefin unit. When the content of the ethylene unit is less than 60 mole % and the content of the α-olefin unit exceeds 40 mole %, the strength of the composition obtained tends to be reduced, while when the content of the ethylene unit exceeds 95 mole % and the content of the α-olefin unit is less than 5 mole %, the flexibility after photocuring of the composition obtained tends to be deteriorated.

The above non-conjugated diene includes as its examples 5-ethylidene-2-norbornene, dicyclopentadiene, tricyclopentadiene, 2,5-norbornadiene, 5-methyl-2,5-norbornadiene, 5-methylene-2-norbronene, 5-vinyl-2-norbornene, 5-isopropenyl-2-norbornene, 5-(1-butenyl)-2-norbornene, 1,5-cyclooctadiene, 4-vinyl-1-cyclohexene, 1,5,9-cyclododecatriene, 6-methyl-4,7,8,9-tetrahydroindene, 2,2'-dicyclopentenyl, trans-1,2-divinylcyclobutane, dicyclooctadiene, 1,4-hexadiene, 1,5-hexadiene, 1,6-heptadiene, 2-methyl-1,4-hexadiene, 4-methyl-1,4-hexadiene, 5-methyl-1,4-hexadiene, 1,6-octadiene, 1,7-octadiene, 1,8-nonadiene, 7-methyl-1,6-octadiene, 1,9-decadiene, 3,6-dimethyl-1,7-octadiene, 4,5-dimethyl-1,7-octadiene, 5-methyl-1,8-nonadiene, 1,4,7-octatriene and the like, and preferable are 5-ethylidene-2-norbornene, dicyclopentadiene and 1,9-decadiene.

These non-conjugated dienes can be used alone or in admixture of two or more.

In the recurring units of the ethylene-α-olefin copolymer (iii), the content of the non-conjugated diene unit is usually not more than 12 mole % of all the monomer units.

Moreover, the ethylene-α-olefin copolymer (iii) may, if necessary, have introduced thereinto at least one functional group selected from the group consisting of carboxyl group, amino group, hydroxyl group, epoxy group, sulfonic acid group and phosphoric acid group.

In the water-developable photosensitive resin composition of this invention, the amount of the ethylene-α-olefin copolymer (iii) used can be appropriately selected so as to meet the purpose; however, it is preferably 1 to 500 parts by weight, more preferably 1 to 300 parts by weight, per 100 parts by weight of the particulate copolymer (1). When the amount of the ethylene-α-olefin copolymer used is less than 1 part by weight, the water-developability of the composition obtained tends to be deteriorated, while when the amount exceeds 500 parts by weight, the strength of the composition obtained tends to be reduced.

(3) Photopolymerizable Unsaturated Compound

The photopolymerizable unsaturated compound (3) which is one of the constituents of the water-developable photosensitive resin composition of this invention is not critical, and includes as its examples:

vinyl aromatic compounds such as styrene, α-methylstyrene, o-vinyltoluene, m-vinyltoluene, p-vinyltoluene, p-t-butylstyrene, o-methoxylstyrene, m-methoxystyrene, p-methoxystyrene, divinylbenzene, diisopropenylbenzene, o-chlorostyrene, m-chlorostyrene, p-chlorostyrene, 1,1-diphenylethylene, N,N-dimethyl-p-aminostyrene, N,N-diethyl-p-aminostyrene, vinylpyridine, o-hydroxystyrene, m-hydroxystyrene, p-hydroxystyrene, o-hydroxy-α-methylstyrene, m-hydroxy-α-methylstyrene, p-hydroxy-α-methylstyrene, p-vinylbenzyl alcohol and the like;

unsaturated nitriles such as (meth)acrylonitrile, α-chloroacrylonitrile, α-chloromethylacrylonitrile, α-methoxyacrylonitrile, α-ethoxyacrylonitrile, crotononitrile, cinnamonitrile, itacononitrile, maleonitrile, fumaronitrile and the like;

alkyl (meth)acrylates such as methyl (meth)acrylate, ethyl (meth)acrylate, n-propyl (meth)acrylate, i-propyl (meth) acrylate, n-butyl (meth)acrylate, i-butyl (meth)acrylate, sec-butyl (meth)acrylate, t-butyl (meth)acrylate, n-amyl (meth)acrylate, n-hexyl (meth)acrylate, 2-ethylhexyl (meth)acrylate, n-octyl (meth)acrylate, lauryl (meth) acrylate, stearyl (meth)acrylate and the like;

other unsaturated monocarboxylic esters such as methyl crotonate, ethyl crotonate, n-propyl crotonate, n-butyl crotonate, methyl cinnamate, ethyl cinnamate, n-propyl cinnamate, n-butyl cinnamate and the like;

unsaturated dicarboxylic diesters such as dimethyl maleate, diethyl maleate, di-n-butyl maleate, di-n-octyl maleate, di-n-hexyl maleate, diethyl fumarate, di-n-butyl fumarate, di-n-hexyl fumarate, di-n-octyl fumarate, dimethyl itaconate, diethyl itaconate, di-n-butyl itaconate, di-n-hexyl itaconate, di-n-octyl itaconate and the like;

fluoroalkyl (meth)acrylates such as 2,2,2-trifluoroethyl (meth)acrylate, 3,3,3,2,2-pentafluoropropyl (meth) acrylate, 4,4,4,3,3,2,2-heptafluorobutyl (meth)acrylate and the like;

mono- or di-(meth)acrylates of alkylene glycols such as ethylene glycol, 1,2-propanediol, 1,3-propanediol, 3-chloro-1,2-propanediol, 1,4-butanediol, 1,5-pentanediol, 1,6-hexanediol and the like;

mono- or di-(meth)acrylates of polyalkylene glycols (the number of alkylene glycol units is, for example, 2 to 23) such as polyethylene glycol, polypropylene glycol and the like;

alkoxyalkyl (meth)acrylates such as 2-methoxyethyl (meth) acrylate, 2-ethoxyethyl (meth)acrylate, 2-methoxypropyl (meth)acrylate, 2-ethoxypropyl (meth)acrylate, 3-methoxypropyl (meth)acrylate, 3-ethoxypropyl (meth) acrylate and the like;

(meth)acrylates of alkoxypolyalkylene glycols (the number of alkylene glycol units is, for example, 2 to 23) such as methoxypolyethylene glycol, ethoxypolyethylene glycol, methoxypolypropylene glycol, ethoxypolypropylene glycol and the like;

aryloxyalkyl (meth)acrylates such as 2-phenoxyethyl (meth) acrylate, 2-phenoxypropyl (meth)acrylate, 3-phenoxypropyl (meth)acrylate and the like;

(meth)acrylates of aryloxypolyalkylene glycols (the number of alkylene glycol units is, for example, 2 to 23) such as phenoxypolyethylene glycol, phenoxypolypropylene glycol and the like;

cyanoalkyl (meth)acrylates such as 2-cyanoethyl (meth) acrylate, 2-cyanopropyl (meth)acrylate, 3-cyanopropyl (meth)acrylate and the like;

mono- or oligo-(meth)acrylates of trihydric or more hydric alcohols such as glycerol, 1,2,4-butanetriol, pentaerythritol, trimethylolalkanes (the alkane has, for example, 1 to 3 carbon atoms), tetramethylolalkanes (the alkane has, for example, 1 to 3 carbon atoms) and the like;

mono- or oligo-(meth)acrylates of polyalkylene glycol adducts (the number of alkylene glycol unit is, for example, 2 to 23) of the above-mentioned trihydric or more hydric alcohols;

mono- or oligo-(meth)acrylates of cyclic polyols such as 1,4-cyclohexanediol, 1,4-benzenediol, 1,4-di-(2-hydroxyethyl)benzene and the like;

hydroxyalkyl esters of other unsaturated monocarboxylic acids such as 2-hydroxyethyl crotonate, 2-hydroxypropyl crotonate, 3-hydroxypropyl crotonate, 2-hydroxyethyl cinnamate, 2-hydroxypropyl cinnamate, 3-hydroxypropyl cinnamate and the like;

N-hydroxyalkyl group-containing amides of unsaturated monocarboxylic acids such as N-hydroxymethyl (meth) acrylamide, N-(2-hydroxyethyl) (meth)acrylamide, N,N-bis(2-hydroxyethyl) (meth)acrylamide, N-hydroxymethyl crotonamide, N-(2-hydroxyethyl) crotonamide, N-hydroxymethyl cinnamamide, N-(2-hydroxyethyl) cinnamamide and the like;

unsaturated alcohols such as (meth)allyl alcohol and the like;

unsaturated monocarboxylic acids such as (meth)acrylic acid, crotonic acid, cinnamic acid and the like;

unsaturated polycarboxylic acids (anhydrides) such as maleic acid (anhydride), fumaric acid, itaconic acid (anhydride), citraconic acid, mesaconic acid and the like;

free carboxyl group-containing esters such as monomethyl ester, monoethyl ester, mono-n-propyl ester, mono-n-butyl ester, mono-n-hexyl ester, mono-n-octyl ester and the like of the above-mentioned unsaturated polycarboxylic acids;

free carboxyl group-containing nitriles such as mononitriles of the above-mentioned polycarboxylic acids, and the like;

free carboxyl group-containing amides such as monoamides of the above-mentioned unsaturated polycarboxylic acids, and the like;

free carboxyl group-containing hydroxyalkyl esters such as mono-2-hydroxyethyl ester, mono-2-hydroxypropyl ester, mono-3-hydroxypropyl ester and the like of the above unsaturated polycarboxylic acids;

N-hydroxyalkyl derivatives of free carboxyl group-containing amides of the above-mentioned unsaturated polycarboxylic acids;

free carboxyl group-containing esters such as monoesters of non-polymerizable polycarboxylic acids such as phthalic acid, succinic acid, adipic acid and the like with hydroxyl group-containing unsaturated compounds such as (meth) allyl alcohol, 2-hydroxyethyl (meth)acrylate and the like, etc.;

dialkylaminoalkyl (meth)acrylates such as dimethylaminomethyl (meth)acrylate, diethylaminomethyl (meth) acrylate, 2-dimethylaminoethyl (meth)acrylate, 2-diethylaminoethyl (meth)acrylate, 2-(di-n-propylamino)ethyl (meth)acrylate, 2-dimethylaminopropyl (meth)acrylate, 2-diethylaminopropyl (meth)acrylate, 2-(di-n-propylamino)propyl (meth)acrylate, 3-dimethylaminopropyl (meth)acrylate, 3-diethylaminopropyl (meth)acrylate, 3-(di-n-propylamino)propyl (meth)acrylate and the like;

dialkylaminoalkoxyalkyl (meth)acrylates such as 2-(dimethylaminoethoxy)ethyl (meth)acrylate, 2-(diethylaminoethoxy)ethyl (meth)acrylate and the like;

N-dialkylaminoalkyl group-containing (meth)acrylamides such as N-dimethylaminomethyl (meth)acrylamide, N-diethylaminomethyl (meth)acrylamide, N-(2-dimethylaminoethyl) (meth)acrylamide, N-(2-diethylaminoethyl) (meth)acrylamide, N-(2-dimethylaminopropyl) (meth)acrylamide, N-(2-diethylaminopropyl) (meth)acrylamide, N-(3-dimethylaminopropyl) (meth)acrylamide, N-(3-diethylaminopropyl) (meth)acrylamide and the like;

epoxy group-containing unsaturated compounds such as allyl glycidyl ether, glycidyl (meth)acrylate, 3,4-oxycyclohexyl (meth)acrylate and the like;

unsaturated amides or unsaturated imides such as (meth) acrylamide, N,N'-methylenebis(meth)acrylamide, N,N'-ethylenebis(meth)acrylamide, N,N'-hexamethylenebis (meth)acrylamide, crotonamide, cinnamamide, maleimide and the like;

vinyl chloride; vinyl acetate; dicyclopentadiene; ethylidenenorbornene; and the like.

These photopolymerizable unsaturated compounds can be used alone or in admixture of two or more.

In this invention, the physical properties after photocuring of the water-developable photosensitive resin composition can be freely designed by selecting the above-mentioned photopolymerizable unsaturated compound (3) from the above-mentioned various compounds.

The photopolymerizable unsaturated compound (3) can be used in any proportion according to the purpose of use of the water-developable photosensitive resin composition, and depending upon the amount of the photopolymerizable unsaturated compound (3) used, the fluidity of the composition can be freely designed from waxy or rubbery to low viscosity liquid; however, the amount of the photopolymerizable unsaturated compound (3) used is preferably 5 to 1,000 parts by weight, more preferably 10 to 500 parts by weight, per 100 parts by weight of the particulate copolymer (1). When the amount of the photopolymerizable unsaturated compound (3) used is less than 5 parts by weight, the strength of the composition obtained tends to be reduced, while when the amount exceeds 1,000 parts by weight, the shrinkage after photocuring of the composition becomes large, it becomes difficult to reconcile the water resistance and water-developability of the composition, and the freeness of viscosity design of the composition tends to be small.

The water-developable photosensitive resin composition of this invention is characterized by using a particulate copolymer having at least one functional group selected from the group consisting of carboxyl group, amino group, hydroxyl group, epoxy group, sulfonic acid group and phosphoric acid group as the particulate copolymer (1) which is one of the constituents of the composition, and various compounds can be used as the photopolymerizable unsaturated compound (3) which is another constituent. However, from the viewpoint that it is possible to easily control the characteristics of the water-developable photosensitive resin composition obtained in a very broad range, it is preferable to combine the particulate copolymer (1) with the photopolymerizable unsaturated compound (3) so that at least one of the two has a carboxyl group as the functional group and at least the other has an amino group as the functional group. The molar ratio of the amino group to the carboxyl group in such a water-developable photosensitive resin composition is preferably at least 0.1, more preferably at least 0.4. When the molar ratio of the amino group is less than 0.1, the water-developability of the composition obtained tends to be deteriorated.

(4) Photopolymerization Initiator

As the photopolymerization initiator (4) which is one of the constituents of the water-developable photosensitive resin composition of this invention, there can be mentioned, for example, α-diketones such as diacetyl, benzil and the like; acyloins such as benzoin, pivaloin and the like; acyloin ethers such as benzoin methyl ether, benzoin ethyl ether, benzoin n-propyl ether and the like; polynuclear quinones such as anthraquinone, 1,4-naphthoquinone and the like; acetophenones such as 2,2-dimethoxyphenylacetophenone, trichloroacetophenone and the like; benzophenones such as benzophenone, methyl-o-benzoylbenzoate and the like; etc. which are usually used as photosensitizer. These photopolymerization initiators can be used alone or in admixture of two or more.

The amount of the photopolymerization initiator (4) used is preferably 0.1 to 20 parts by weight, more preferably 1 to 10 parts by weight, per 100 parts by weight of the particulate copolymer (1). When the amount of the photopolymerization initiator (4) used is less than 0.1 part by weight, the curing of the composition obtained becomes insufficient in some cases, while when it exceeds 20 parts by weight, not all the photopolymerization initiator used participates in the reaction, so that it is uneconomical and, in some cases, the compatibility thereof with the particulate copolymer (1), the copolymer (2) and the photopolymerizable unsaturated compound (3) becomes bad and the dispersion thereof becomes ununiform in some cases.

Other Additives

Furthermore, to the water-developable photosensitive resin composition can be added a non-polymerizable compound having at least one functional group selected from the group consisting of carboxyl group, amino group, hydroxyl group and epoxy group in a proportion of not more than 20% by weight of the total weight of the composition.

As specific examples of the above-mentioned non-polymerizable compound, there can be mentioned carboxylic acids such as formic acid, acetic acid, propionic acid and the like; primary amines such as ethylamine, propylamine and the like; secondary amines such as diethylamine, di-n-propylamine, di-n-butylamine and the like; tertiary amines, for example, trialkylamines such as trimethylamine, triethylamine, tri-n-propylamine, tri-n-butylamine, ethyldimethylamine, diethylmethylamine and the like, and trialkanolamines such as triethanolamine, tripropanolamine and the like; alcohols such as methanol, ethanol, n-propanol, n-butanol and the like; epoxy compounds such as 1,2-epoxybutane, 1,2-epoxyhexane and the like; etc. These non-polymerizable compounds can be used alone or in admixture of two or more.

Moreover, to the water-developable photosensitive resin composition of this invention can be added, if necessary, a conventional additive, for example, a thermal addition polymerization inhibitor, in a proportion ranging from 0.001 to 2.0% by weight of the total weight of the composition.

As specific examples of the above-mentioned thermal addition polymerization inhibitor, there are mentioned hydroxyaromatic compounds such as hydroquinone, hydroquinone monomethyl ether, mono-t-butyl-hydroquinone, catechol, p-methoxyphenol, p-t-butyl-catechol, 2,6-di-t-butyl-p-cresol, 2,6-di-t-butyl-m-cresol, pyrogallol, β-naphthol and the like; quinones such as benzoquinone, 2,5-diphenyl-p-benzoquinone, p-toluquinone, p-xyloquinone and the like; nitro compounds, nitroso compounds or nitrone compounds such as nitrobenzene, m-dinitrobenzene, 2-methyl-2-nitrosopropane, α-phenyl-t-butylnitrone, 5,5-dimethyl-1-pyrroline-1-oxide and the like; amines such as chloranil-amine type, diphenylamine, diphenylpicrylhydrazine, phenol-α-naphthylamine, pyridine, phenothiazine and the like; sulfides such as dithiobenzoyl sulfide, dibenzyl tetrasulfide and the like; unsaturated compounds such as 1,1-diphenylethylene, α-methylthioacrylonitrile and the like; thiazine dyes such as Thionine Blue, Toluidine Blue, Methylene Blue and the like; stable radicals such as 1,1-diphenyl-2-picrylhydrazyl, 1,3,5-triphenylpheldazyl, 4-hydroxy-2,2,6,6-tetramethylpiperidin-1-oxyl, 2,6-di-t-butyl-α-(3,5-di-t-butyl)-4-oxo-2,5-cyclohexadien-1-ylidene-p-trioxyl and the like; etc. These thermal addition polymerization inhibitors can be used alone or in admixture of two or more.

Preparation and Use of Water-developable Photosensitive Resin Composition

The water-developable photosensitive resin composition of this invention is prepared by sufficiently mixing (1) the particulate copolymer, (2) at least one copolymer selected from the group consisting of the block-like copolymers (i) and (ii) and the ethylene-α-olefin copolymer (iii), (3) the photopolymerizable unsaturated compound and (4) the photopolymerization initiator, together with a compounding component to be optionally added, for example, with heating using a kneader, an intermixer or the like. The water-developable photosensitive resin composition thus obtained can be freely designed from waxy or rubbery to low viscosity liquid excellent in fluidity.

A fluidity-free water-developable photosensitive resin composition can be formed into a film having a given thickness using a spacer having a suitable thickness or can be coated on a support by means of a roll coater or the like, or can be processed to a photosensitive resin plate having a given thickness by compression molding, extrusion molding or the like. A negative film is applied thereto and the resulting assembly is exposed to light, after which the unexposed portion is removed by washing the same with water, whereby a printing plate can be obtained.

Moreover, a water-developable photosensitive resin excellent in fluidity can be subjected to viscosity-adjustment by adding, if necessary, a suitable solvent thereto and then used, for example, as a resist suitable for spin coating. In this case, after the exposure to light, the unexposed portion is similarly removed by washing with water, whereby a vivid resist pattern can be formed.

DESCRIPTION OF THE PREFERRED EMBODIMENTS

The mode for carrying out this invention is explained in more detail below referring to Examples; however, this invention should not be construed to be limited to the Examples unless modifications go beyond the gist of the invention.

EXAMPLE 1

Preparation of Particulate Copolymer (1)

A monomer mixture of butadiene/2-diethylaminoethyl methacrylate/divinylbenzene/ethyl acrylate=80/6.5/1.0/12.5 (mole %) was subjected to emulsion polymerization using sodium laurylsulfate as an emulsifier and benzoyl peroxide as a polymerization initiator. The copolymer emulsion obtained was subjected to salt coagulation with calcium chloride and drying to prepare a particulate copolymer. The polymerization conversion at this time was approximately 100%.

Preparation of Block-like Copolymer (2)(i)

In a 2-liter, four-necked, separable flask equipped with a stirrer, a reflux condenser, a dropping funnel and a nitrogen gas-introducing tube was placed 50 g of dioxane, and thereto was added 1.5 g of sulfuric anhydride while the internal temperature was maintained at 20–25° C., after which the resulting mixture was stirred for 2 hours to obtain a sulfuric anhydride-dioxane complex. Subsequently, a solution of 50 g of a styrene-isoprene-styrene block copolymer (JSR SIS5000, a trade name of JSR Co., Ltd.) in 335 g of dioxane was dropwise added over several minutes while the internal temperature was maintained at 10–20° C., and after completion of the dropwise addition, the resulting mixture was subjected to reaction for one hour while it was maintained at 30° C. Further, 3.3 g of a 25% by weight aqueous NaOH solution and 200 milliliters of water were successively added thereto, after which the resulting mixture was stirred at 60° C. for one hour, to sulfonate the polyisoprene segment in the block copolymer, thereby obtaining a dioxane solution of a block-like copolymer having a sulfonic acid group in the polymer side chain in which the polymeric segment A/the polymeric segment B=85/15 (weight ratio).

The quantitative analysis of the $SO_3H$ group in the block-like copolymer obtained was effected by the following procedure to find that the $SO_3H$ group content was 0.5 millimoles/g:

Procedure for Quantitative Analysis of $SO_3H$ Group

The dioxane solution of the block-like copolymer was subjected to such reprecipitation-purification that the solution was dropwise added to a mixed solvent of methanol/water=80/20 (weight ratio) to deposit the block-like copolymer, thereby removing the impurities present in the solution, and thereafter, the amount of sulfur element contained in the block-like copolymer was determined by a fluorescent X-ray analysis, and this value was reduced to a $SO_3H$ group content.

Preparation of Water-developable Photosensitive Resin Composition

To 100 parts by weight of the above particulate copolymer (1) was added 30 parts by weight of the above block-like copolymer (2)(i) and were further added 30 parts by weight of lauryl methacrylate, 5 parts by weight of 1,6-hexanediol diacrylate and 20 parts by weight of acrylic acid as the photopolymerizable unsaturated monomers (3), 1 part by weight of 2,2-dimethoxyphenylacetophenone as the photopolymerization initiator (4), and 0.5 part by weight of t-butylcatechol as a storage stabilizer, and the resulting mixture was stirred for 60 minutes in a kneader in which the temperature was maintained at 50° C., to prepare a water-developable photosensitive resin composition (the composition of this invention). The composition obtained was transparent and waxy.

Evaluation

Using the above water-developable photosensitive resin composition, a photosensitive resin plate having a thickness of 0.5 mm was formed on a polyester sheet, and thereafter, brushed in a warm water at 30° C. using a developing machine of Model JOW-A-4P manufactured by Nippon Denshi Seiki K. K., whereby the time required until the photosensitive resin layer disappeared (time required for dissolution) was determined.

The above photosensitive resin plate was exposed to light for 6 minutes using an exposing machine manufactured by Nippon Denshi Seiki K. K. (JE-A3-SS) and subjected to measurement of tensile strength, elongation at break and impact resilience according to JIS K6301.

As a result, this water-developable photosensitive resin composition was excellent in all of water-developability, resin plate strength, elongation at break and impact resilience and good in transparency of resin plate and had an excellent characteristics balance.

The results obtained are shown in Table 1.

EXAMPLE 2

Preparation of Particulate Copolymer (1)

A particulate copolymer was prepared using a monomer mixture of butadiene/methacrylic acid/ethylene glycol dimethacrylate/ethyl acrylate=80/6.5/1.0/12.5 (mole %) according to the same procedure as in Example 1. The polymerization conversion at this time was approximately 100%.

Preparation of Block-like Copolymer (2)(i)

A block-like copolymer having a polymeric segment A/polymeric segment B weight ratio of 86/14 and a $SO_3H$ group content of 0.5 millimoles/g was prepared using a styrene-isoprene-styrene block copolymer manufactured by Shell Chemical Co., Ltd. (Kraton D1107, a trade name of this company) according to the same procedure as in Example 1.

Preparation and Evaluation of Water-developable Photosensitive Resin Composition To 100 parts by weight of the above particulate copolymer (1) was added 30 parts by weight of the above block-like copolymer (2)(i), and were further added 30 parts by weight of lauryl methacrylate, 5 parts by weight of 1,6-hexanediol diacrylate and 20 parts by weight of N-(3-dimethylaminopropyl)acrylamide as the photopolymerizable unsaturated monomers (3), 1 part by weight of 2,2-dimethoxyphenylacetophenone as the photopolymerization initiator (4), and 0.5 part by weight of t-butylcatechol as a storage stabilizer, and according to the same procedure as in Example 1, a water-developable photosensitive resin composition was prepared.

The water-developable photosensitive resin composition obtained was evaluated in the same manner as in Example 1.

As a result, this water-developable photosensitive resin composition was excellent in all of water-developability, resin plate strength, elongation at break and impact resilience and good in transparency of resin plate and had an excellent characteristics balance.

The results obtained are shown in Table 1.

EXAMPLE 3

Preparation of Block-like Copolymer (2)(i)

A block-like copolymer having a polymer segment A/polymer segment B weight ratio of 86/14 and a $SO_3H$ group content of 0.9 millimoles/g was prepared using a styrene-isoprene-styrene block copolymer manufactured by Shell Chemical Co., Ltd. (Kraton D1107, a trade name of this company) according to the same procedure as in Example 1.

Preparation and Evaluation of Water-developable Photosensitive Resin Composition According to the same procedure as in Example 2, except that the above block-like copolymer (2)(i) was used, a water-developable photosensitive resin composition was prepared and evaluated.

As a result, this water-developable photosensitive resin composition was excellent in all of water-developability, resin plate strength, elongation at break and impact resilience and good in transparency of resin plate and had an excellent characteristics balance.

The results obtained are shown in Table 1.

EXAMPLE 4

Preparation of Particulate Copolymer (1)

A particulate copolymer was prepared using a monomer mixture of butadiene/methacrylic acid/ethylene glycol dimethacrylate/ethyl acrylate=80/6.5/1.0/12.5 (mole %) according to the same procedure as in Example 1. The polymerization conversion at this time was approximately 100%.

Preparation of Water-developable Resin Composition

To 100 parts by weight of the above particulate copolymer (1) was added an ethylene-α-olefin copolymer manufactured by JSR Co., Ltd. (JSR EP103A, a trade name of this company) as the component (2)(iii), and were further added 30 parts by weight of lauryl methacrylate, 5 parts by weight of 1,6-hexanediol diacrylate and 20 parts by weight of N-(3-dimethylaminopropyl) acrylamide as the photopolymerizable unsaturated monomers (3), 1 part by weight of 2,2-dimethoxyphenylacetophenone as the photopolymerization initiator (4), and 0.5 part by weight of t-butylcatechol as a storage stabilizer, and the resulting mixture was stirred for 30 minutes in a kneader in which the temperature was adjusted to 50° C. to prepare a water-developable photosensitive resin composition (the composition of this invention). The composition obtained was transparent and waxy.

Evaluation

Using the above-mentioned water-developable photosensitive resin composition, a photosensitive resin plate having a thickness of 0.5 mm was formed on a polyester sheet, and thereafter, brushed in a warm water at 30° C. using a developing machine of Model JOW-A-4P manufactured by Nippon Denshi Seiki K. K., whereby the time required until the photosensitive resin layer disappeared (time required for dissolution) was determined.

Moreover, the above-mentioned photosensitive resin plate was exposed to light for 6 minutes using an exposing machine manufactured by Nippon Denshi Seiki K. K. (JE-A3-SS) and thereafter subjected to measurement of hardness of cured product and impact resilience according to JIS K6301.

As a result, this water-developable photosensitive resin composition was excellent in water-developability and impact resilience, had a low hardness, was good in transparency of resin plate and had an excellent characteristics balance.

The results obtained are shown in Table 2.

EXAMPLE 5

Preparation and Evaluation of Water-developable Photosensitive Resin Composition To 100 parts by weight of the same particulate copolymer (1) as in Example 1 was added 30 parts by weight of an ethylene-α-olefin copolymer manufactured by JSR Co., Ltd. (JSR EP65, a trade name of this company) as the component (2)(iii), and were further added 30 parts by weight of lauryl methacrylate, 5 parts by weight of 1,6-hexanediol diacrylate and 20 parts by weight of acrylic acid as the photopolymerizable unsaturated monomers (3), 1 part by weight of 2,2-dimethoxyphenylacetophenone as the photopolymerization initiator, and 0.5 part by weight of t-butylcatechol as a storage stabilizer, and according to the same procedure as in Example 4, a water-developable photosensitive resin composition was prepared and evaluated.

As a result, this water-developable photosensitive resin composition was excellent in water-developability and impact resilience, had a low hardness, was good in transparency of resin plate and had an excellent characteristics balance.

The results obtained are shown in Table 2.

EXAMPLE 6

Preparation of Particulate Copolymer (1)

A particulate copolymer was prepared using a monomer mixture of butadiene/methacrylic acid/divinylbenzene/ methyl methacrylate=80/6.5/1.0/12.5 (mole %) according to the same procedure as in Example 1. The polymerization conversion at this time was approximately 100%.

Preparation and Evaluation of Water-developable Photosensitive Resin Composition To 100 parts by weight of the above particulate copolymer (1) was added 30 parts by weight of an ethylene-α-olefin copolymer manufactured by JSR Co., Ltd. (JSR EP24, a trade name of this company) as the component (2)(iii), and were further added 30 parts by weight of lauryl methacrylate, 5 parts by weight of 1,6-hexanediol diacrylate and 20 parts by weight of N-(3-dimethylaminopropyl) acrylamide as the photopolymerizable unsaturated monomers (3), 1 part by weight of 2,2-dimethoxyphenylacetophenone as the photopolymerization initiator (4), and 0.5 part by weight of t-butylcatechol as a storage stabilizer, and according to the same procedure as in Example 4, a water-developable photosensitive resin composition was prepared and evaluated.

As a result, this water-developable photosensitive resin composition was excellent in water-developability and impact resilience, had a low hardness, was good in transparency of resin plate and had an excellent characteristics balance.

The results obtained are shown in Table 2.

EXAMPLE 7

Preparation and Evaluation of Water-developable Photosensitive Resin Composition To 100 parts by weight of the same particulate copolymer (1) as in Example 1 was added 333 parts by weight of an ethylene-α-olefin copolymer manufactured by JSR Co., Ltd. (JSR EP65, a trade name of this company) as the component (2)(iii), and were further added 100 parts by weight of lauryl methacrylate, 17 parts by weight of 1,6-hexanediol diacrylate and 67 parts by weight of N-(3-dimethylaminopropyl) acrylamide as the photopolymerizable unsaturated monomers (3), 3.3 parts by weight of 2,2-dimethoxyphenylacetophenone as the photopolymerization initiator (4), and 1.7 parts by weight of t-butylcatechol as a storage stabilizer, and according to the same procedure as in Example 4, a water-developable photosensitive resin composition was prepared and evaluated.

As a result, this water-developable photosensitive resin composition was excellent in water-developability and impact resilience, had a low hardness, was good in transparency of resin plate and had an excellent characteristics balance.

The results obtained are shown in Table 2.

COMPARATIVE EXAMPLE 1

According to the same procedures as in Example 1 and Example 4, a photosensitive resin composition was prepared, except that 30 parts by weight of a styrene-isoprene-styrene block copolymer manufactured by Shell Chemical Co., Ltd. (Kraton D1107, a trade name of this company) was substituted for the block-like copolymer (2)(i) used in Example 1 and evaluated.

As a result, this photosensitive resin composition was inferior in water-developability, tensile strength, elongation at break and impact resilience and had a high hardness.

The results obtained are shown in Table 3.

EXAMPLE 8

Preparation of Particulate Copolymer (1)

Using sodium laurylsulfate as an emulsifier and benzoyl peroxide as a polymerization initiator, a monomer mixture of butadiene/methacrylic acid/ethylene glycol dimethacrylate/ethyl acrylate=80/6.5/1.0/12.5 (mole %) was emulsion-polymerized. The copolymer emulsion obtained was subjected to salt-coagulation with calcium chloride and drying to prepare a particulate copolymer. The polymerization conversion at this time was approximately 100%.

Preparation of Block-like Copolymer (2)(ii)

In a 6-liter, three-necked flask equipped with a stirrer, an internal thermometer and a nitrogen-introducing tube was placed 825.86 g of 4,4'-diphenylmethane diisocyanate, and thereafter, 2,095 g of dry dimethylformamide was added thereto under a dry nitrogen stream to make a solution. To the solution was dropwise added a solution prepared by dissolving 198.33 g of ethylenediamine and 7.31 g of diethylamine in 1,000 g of dry dimethylformamide, after which they were subjected to reaction at room temperature, to obtain a solution of a copolymer (the polymeric segment I).

Separately, 400 g of a polytetramethylene ether glycol having a number average molecular weight of 2,000 manufactured by Hodogaya Chemical Co., Ltd. (PTG2000SN, a trade name of this company) was dissolved in 1,000 g of dry dimethylformamide, and to the resulting solution were added successively 412.65 g of the above solution of a copolymer (the polymeric segment I) and a solution prepared by dissolving 45.56 g of 1,5-isophorone diisocyanate in 337 g of dry dimethylformamide, after which they were subjected to reaction at 95° C. by continuing stirring until the absorption of NCO group became nil in an infrared absorption spectrum. Subsequently, the reaction solvent was removed to separate a polymer.

The polymer obtained was subjected to elementary analysis to determine the weight ratio between the polymeric segment I and the polymeric segment III in the polymer. As a result, the polymeric segment I/polymeric segment III ratio was 19/81 (by weight).

Preparation of Water-developable Photosensitive Resin Composition

To 100 parts by weight of the above-mentioned particulate copolymer (1) was added 30 parts by weight of the above-mentioned block-like copolymer (2)(ii) and were further added 30 parts by weight of lauryl methacrylate, 5 parts by weight of 1,6-hexanediol diacrylate and 20 parts by weight of N-(3-dimethylaminopropyl)acrylamide as the photopolymerizable unsaturated monomers (3), 1 part by weight of 2,2-dimethoxyphenylacetophenone as the photopolymerization initiator (4), and 0.5 part by weight of t-butylcatechol as a storage stabilizer, and the resulting mixture was stirred for 30 minutes in a kneader in which the temperature was adjusted to 50° C., to obtain a water-developable photosensitive resin composition (the composition of this invention). This composition was transparent and waxy.

Evaluation

Using the water-developable photosensitive resin composition obtained, a photosensitive resin plate having a thickness of 0.5 mm was formed on a polyester sheet, and thereafter, brushed in a warm water at 30° C. using a developing machine of Model JOW-A-4P manufactured by Nippon Denshi Seiki K. K., whereby the time required until the photosensitive resin layer disappeared (time required for dissolution) was determined.

The above-mentioned photosensitive resin plate was exposed to light for 6 minutes using an exposing machine manufactured by Nippon Denshi Seiki K. K. (JE-A3-SS) and thereafter subjected to measurement of tensile strength, elongation at break and impact resilience according to JIS K6301.

As a result, this water-soluble photosensitive resin composition was excellent in water-developability and resin plate strength, good in elongation at break and impact resilience and good in transparency of resin plate, and had an excellent characteristics balance.

The results obtained are shown in Table 4.

EXAMPLE 9

According to the following procedure, the particulate copolymer (1) and the block-like copolymer (2) (ii) were prepared:

Preparation of Particulate Copolymer (1)

A particulate copolymer was prepared according to the same procedure as in Example 8 using a monomer mixture of butadiene/2-diethylaminoethyl methacrylate=80/6.5/1.0/12.5 (mole %). The polymerization conversion at this time was approximately 100%.

Preparation of Block-like Copolymer (2)(ii)

In a 6-liter, three-necked flask equipped with a stirrer, an internal thermometer and a nitrogen-introducing tube was placed 825.86 g of 4,4'-diphenylmethane diisocyanate and then thereto was added 2,095 g of dry dimethylformamide under a dry nitrogen stream to prepare a solution. To the solution was dropwise added a solution prepared by dissolving 198.33 g of ethylenediamine and 7.31 g of diethylamine in 1,000 g of dry dimethylformamide, after which they were subjected to reaction at room temperature to obtain a solution of a polymer (the polymeric segment I).

Separately, 250.26 g of 4,4'-diphenylmethane diisocyanate was dissolved in 1,293 g of dry dimethylformamide, and to the resulting solution was dropwise added a solution prepared by dissolving 840 g of dimethylpolysiloxane having amino groups at both terminals of the molecular chain manufactured by Toshiba Silicone Co., Ltd.(TSL9386, a trade name of this company) and 7.31 g of diethylamine in 2,000 g of dry dimethylformamide, after which they were subjected to reaction at room temperature, to obtain a solution of a polymer (the polymeric segment IV).

Subsequently, 412.65 g of the above-mentioned solution of a polymer (the polymeric segment I), 438.33 g of the above-mentioned solution of a polymer (the polymeric segment IV) and a solution prepared by dissolving 84.47 g of 1,5-isophorone diisocyanate in 503 g of dry dimethylformamide were successively added to a solution prepared by dissolving 750 g of a polytetramethylene ether glycol having a number average molecular weight of 2,000 manufactured by Hodogaya Chemical Co., Ltd. (PTG2000SN, a trade name of this company) in 2,000 g of dry dimethylformamide, and thereafter, they were subjected to reaction at 95° C. by continuing stirring until the absorption of NCO group became nil in an infrared absorption spectrum. Subsequently, the reaction solvent was removed to separate a polymer.

The polymer obtained was subjected to elementary analysis and infrared spectroscopic analysis to determine the weight ratio among the polymeric segment I, the polymeric segment III and the polymeric segment IV. As a result, the polymeric segment I/the polymeric segment III/the polymeric segment IV ratio was 9/80/11 (by weight).

Preparation and Evaluation of Water-developable Photosensitive Resin Composition To 100 parts by weight of the above-mentioned particulate copolymer was added 30 parts by weight of the above-mentioned block-like copolymer (2)(ii), and were further added 30 parts by weight of lauryl methacrylate, 5 parts by weight of 1,6-hexanediol diacrylate and 20 parts by weight of acrylic acid as the photopolymerizable unsaturated monomers (3), 1 part by weight of 2,2-dimethoxyphenylacetophenone as the photopolymerization initiator (4), and 0.5 part by weight of t-butylcatechol as a storage stabilizer, and according to the same procedure as in Example 8, a water-developable photosensitive resin composition (the composition of this invention) was prepared. This composition was transparent and waxy.

The water-developable photosensitive resin composition obtained was evaluated in the same manner as in Example 8.

As a result, this water-developable photosensitive resin composition was excellent in water-developability and resin plate strength, good in elongation at break and impact resilience and also good in transparency of resin plate, and had an excellent characteristics balance.

The results obtained are shown in Table 4.

EXAMPLE 10

According to the following procedure, the particular copolymer (1) and the block-like copolymer (2) (ii) were prepared:

Preparation of Particulate Copolymer (1)

Using sodium laurylsulfate as an emulsifier and benzoyl peroxide as a polymerization initiator, a monomer mixture of butadiene/methacrylic acid/divinylbenzene/methyl methacrylate=80/6.5/1.0/12.5 (mole %) was emulsion polymerized. The copolymer emulsion obtained was subjected to salt-coagulation with calcium chloride and then drying, to prepare a particulate copolymer. The polymerization conversion at this time was approximately 100%.

Preparation of Block-like Copolymer (2)(ii)

In a 6-liter, three-necked flask equipped with a stirrer, an internal thermometer and a nitrogen-introducing tube was placed 825.86 g of 4,4'-diphenylmethane diisocyanate and then thereto was added 2,095 g of dry dimethylformamide under a dry nitrogen stream to prepare a solution. To the solution was dropwise added a solution prepared by dissolving 198.33 g of ethylenediamine and 7.31 g of diethylamine in 1,000 g of dry dimethylformamide, after which they were subjected to reaction at room temperature to obtain a solution of a polymer (the polymeric segment I).

Separately, 406 g of polybutadiene having a hydroxyl groups at both terminals of the molecular chain and having a number average molecular weight of 2,800 manufactured by Idemitsu Sekiyu Kagaku K. K. (Poly bd R-45HT, a trade name of this company) was dissolved in 1,000 g of dry dimethylformamide and to the solution were successively added 412.65 g of the above-mentioned solution of a polymer (the polymeric segment I) and a solution prepared by dissolving 32.23 g of 1,5-isophorone diisocyanate in 315 g of dry dimethylformamide, after which they were subjected to reaction at 95° C. by continuing stirring until the absorption of NCO group became nil in an infrared absorption spectrum. Subsequently, the reaction solvent was removed to separate a polymer.

The polymer obtained was subjected to elementary analysis to determine the weight ratio between the polymeric segment I and the polymeric segment V. As a result, the polymeric segment I/the polymeric segment V ratio was 20/80 (by weight).

Preparation and Evaluation of Water-developable Photosensitive Resin Composition Using the above-mentioned particulate copolymer (1) and block-like copolymer (2)(ii), a water-developable photosensitive resin composition (the composition of this invention) was prepared according to the same procedure as in Example 8. This composition was transparent and waxy.

The water-developable photosensitive resin composition obtained was evaluated according to the same procedure as in Example 8.

As a result, this water-developable photosensitive resin composition was excellent in water-developability and resin plate strength, good in elongation at break and impact resilience and also good in transparency of resin plate, and had an excellent characteristics balance.

The results obtained are shown in Table 4.

EXAMPLE 11

According to the following procedure, the block-like copolymer (2)(ii) was prepared:

Preparation of Block-like Copolymer (2)(ii)

In a 6-liter, three-necked flask equipped with a stirrer, an internal thermometer and a nitrogen-introducing tube was placed 94.60 g of 4,4'-diphenylmethane diisocyanate, and 944 g of dry dimethylformamide was added thereto under a dry nitrogen stream to prepare a solution. To this solution was added a solution prepared by dissolving 720 g of a polytetramethylene ether glycol having a number average molecular weight of 2,000 manufactured by Hodogaya Chemical Co., Ltd.(PTG2000SN, a trade name of this company) in 1,500 g of dry dimethylformamide, and thereafter, they were subjected to reaction with stirring at 95° C. for 90 minutes under a nitrogen gas stream, to obtain a prepolymer having isocyanato groups at both terminals of the molecular chain.

Subsequently, thereto were successively added a solution prepared by dissolving 60.56 g of 1,4-phenylenediamine in 152 g of dry dimethylformamide and a solution prepared by dissolving 140.15 g of 4,4'-diphenylmethane diisocyanate in 450 g of dry dimethylformamide, and then, they were subjected to reaction by continuing stirring at 95° C. until the absorption of NCO group became nil in an infrared absorption spectrum. Subsequently, the reaction solvent was removed to separate a polymer.

The polymer obtained was subjected to elementary analysis to determine the weight ratio between the polymeric segment I and the polymeric segment III. As a result, the polymeric segment I/the polymeric segment III ratio was 20/80 by weight.

Preparation and Evaluation of Water-developable Photosensitive Resin Composition Using the above-mentioned block-like copolymer (2)(ii), a water-developable photosensitive resin composition (the composition of this invention) was prepared according to the procedure as in Example 8. This composition was transparent and waxy.

The water-developable photosensitive resin composition obtained was evaluated according to the same procedure as in Example 8.

As a result, this water-developable photosensitive resin composition was excellent in water-developability and resin plate strength, good in elongation at break and impact resilience and also good in transparency of resin plate, and had an excellent characteristics balance.

The results obtained are shown in Table 4.

COMPARATIVE EXAMPLE 2

According to the same procedure as in Example 8, except that a styrene-isoprene type thermoplastic elastomer manufactured by JSR Co., Ltd. (JSR SIS5000, a trade name of this company) was substituted for the block-like copolymer (2)(ii), a photosensitive resin composition was prepare and evaluated.

As a result, this photosensitive resin composition was inferior in water-developability, resin plate strength, elongation at break and impact resilience.

The results obtained are shown in Table 4.

TABLE 1

| Photosensitive resin | Example | | |
| --- | --- | --- | --- |
| composition | 1 | 2 | 3 |
| (1) Particulate copolymer | | | |
| Amount (part by wt.) | 100 | 100 | 100 |
| Copolymer composition (mole %) | | | |
| (a) Butadiene | 80 | 80 | 80 |
| (b) Methacrylic acid | — | 6.5 | 6.5 |
| 2-Diethylaminoethyl methacrylate | 6.5 | — | — |
| (c) Ethylene glycol dimethacrylate | — | 1.0 | 1.0 |
| Divinylbenzene | 1.0 | — | — |
| (d) Ethyl acrylate | 12.5 | 12.5 | 12.5 |
| Methyl methacrylate | — | — | — |
| (2) Block-like copolymer (i) | | | |
| Amount (part by wt.) | 30 | 30 | 30 |
| Polymeric segment (A) content (wt. %) | 85 | 86 | 86 |
| Polymeric segment (B) content (wt. %) | 15 | 14 | 14 |
| Sulfonic acid group content (mmole/g) | 0.5 | 0.5 | 0.5 |
| (3) Photopolymerizable unsaturated monomer (part by wet.) | | | |
| Lauryl methacrylate | 30 | 30 | 30 |
| 1,6-Hexanediol diacrylate | 5 | 5 | 5 |
| N-(3-Dimethylaminopropyl)-acrylamide | — | 20 | 20 |
| Acrylic acid | 20 | — | — |
| (4) Photopolymerization initiator (part by wt.) | | | |
| 2,2-Dimethoxyphenylacetophenone | 1 | 1 | 1 |
| - Other components (part by wt.) | | | |
| p-t-Butyl catechol | 0.5 | 0.5 | 0.5 |
| Evaluation | | | |
| Time requirement for dissolution (sec) | 105 | 110 | 100 |
| Tensile strength (kgf/cm$^2$) | 28 | 33 | 29 |
| Elongation at break (%) | 115 | 125 | 120 |
| Impact resilience | 33 | 33 | 32 |

TABLE 2

| Photosensitive resin composition | Example 4 | Example 5 | Example 6 | Example 7 |
|---|---|---|---|---|
| (1) Particulate copolymer | | | | |
| Amount (part by wt.) | 100 | 100 | 100 | 100 |
| copolymer composition (mole %) | | | | |
| (a) Butadiene | 80 | 80 | 80 | 80 |
| (b) Methacrylic acid | 6.5 | — | 6.5 | — |
| 2-Diethylaminoethyl methacrylate | — | 6.5 | — | 6.5 |
| (c) Ethylene glycol dimethacrylate | 1.0 | — | — | — |
| Divinylbenzene | — | 1.0 | 1.0 | 1.0 |
| (d) Ethyl acrylate | 12.5 | 12.5 | — | 12.5 |
| Methyl methacrylate | — | — | 12.5 | — |
| (2) Ethylene-α-olefin copolymer(*) (part by wt.) | | | | |
| JSR EP103A | 30 | — | — | — |
| JSR EP65 | — | 30 | — | 333 |
| JSR EP24 | — | — | 30 | — |
| (3) Photopolymerizable unsaturated monomer (part by wt.) | | | | |
| Lauryl methacrylate | 30 | 30 | 30 | 100 |
| 1,6-Hexanediol diacrylate | 5 | 5 | 5 | 17 |
| N-(3-Dimethylaminopropyl)-acrylamide | 20 | — | 20 | 67 |
| Acrylic acid | — | 20 | — | — |
| (4) Photopolymerization initiator (part by wt.) | | | | |
| 2,2-Dimethoxyphenylacetone | 1 | 1 | 1 | 3.3 |
| - Other components (part by weight) | | | | |
| p-t-Butyl catechol | 0.5 | 0.5 | 0.5 | 1.7 |
| Evaluation | | | | |
| Time required for dissolution | 130 | 130 | 120 | 170 |
| Hardness (JIS-A) | 63 | 62 | 61 | 49 |
| Impact resilience | 35 | 34 | 34 | 44 |

Note:
*JSR EP103A: Ethylene content 59 wt. %, 3rd component ENB content 4.5 wt. %, $ML_{1+8}$ (120° C.) 92.
JSR EP65: Ethylene content 54 wt. %, 3rd component ENB content 9.0 wt. %, $ML_{1+4}$ (100° C.) 74.
JSR EP24: Ethylene content 54 wt. %, 3rd component ENB content 4.5 wt. %, $ML_{1+4}$ (100° C.) 65.

TABLE 3

| Photosensitive resin composition | Comp. Example 1 |
|---|---|
| (1) Particulate copolymer | |
| Amount (part by wt.) | 100 |
| Copolymer composition (mole %) | |
| (a) Butadiene | 80 |
| (b) Methacrylic acid | 6.5 |
| 2-Diethylaminoethyl methacrylate | — |
| (c) Ethylene glycol dimethacrylate | 1.0 |
| Divinylbenzene | — |
| (d) Ethyl acrylate | 12.5 |
| Methyl methacrylate | — |
| (2) Block-like copolymer (i) (part by wt.) | — |
| Ethylene-α-olefin copolymer (part by wt.) | — |
| (3) Photopolymerizable unsaturated monomer (part by wt.) | |
| Lauryl methacrylate | 30 |
| 1,6-Hexanediol diacrylate | 5 |
| N-(3-Dimethylaminopropyl)acrylamide | 20 |
| Acrylic acid | — |
| (4) Photopolymerization initiator (part by wt.) | |
| 2,2-Dimethoxyphenylacetophenone | 1 |
| - Other components | |
| p-t-Butylcatechol | 0.5 |
| Kraton D1107 (*) | 30 |
| Evaluation Time required for dissolution (sec) | 290 |
| Tensile strength (kgf/cm$^2$) | 23 |
| Elongation at break (%) | 100 |
| Hardness (JIS-A) | 65 |
| Impact resilience | 29 |

Note:
(*) Styrene-isoprene-styrene block copolymer manufactured by Shell Chemical

TABLE 4

| Photosensitive resin composition | Example 8 | Example 9 | Example 10 | Example 11 | Comp. Example 2 |
|---|---|---|---|---|---|
| (1) Particulate copolymer | | | | | |
| Amount (part by wt.) | 100 | 100 | 100 | 100 | 100 |
| Copolymer composition (mole %) | | | | | |
| (a) Butadiene | 80 | 80 | 80 | 80 | 80 |
| (b) Methacrylic acid | 6.5 | — | 6.5 | 6.5 | 6.5 |
| 2-Diethylaminoethyl methacrylate | — | 6.5 | — | — | — |
| (c) Ethylene glycol dimethacrylate | 1 | — | — | — | 1 |
| Divinylbenzene | — | 1 | 1 | 1 | — |

TABLE 4-continued

|  | Example | | | | Comp. Example |
| --- | --- | --- | --- | --- | --- |
| Photosensitive resin composition | 8 | 9 | 10 | 11 | 2 |
| (d) Ethyl acrylate | 12.5 | 12.5 | — | — | 12.5 |
| Methyl methacrylate | — | — | 12.5 | 12.5 | — |
| (2) Block-like copolymer (ii) | | | | | |
| Amount (part by wt.) | 30 | 30 | 30 | 30 | — |
| Polymeric segment I content (wt. %) | 19 | 9 | 20 | 20 | — |
| Polymeric segment II content (wt. %) | — | — | — | — | — |
| Polymeric segment III content (wt. %) | 81 | 80 | — | 80 | — |
| Polymeric segment IV content (wt. %) | — | 11 | — | — | — |
| Polymeric segment V content (wt. %) | — | — | 80 | — | — |
| (3) Photopolymerizable unsaturated monomer (part by wt.) | | | | | |
| Lauryl methacrylate | 30 | 30 | 30 | 30 | 30 |
| 1,6-Hexanediol diacrylate | 5 | 5 | 5 | 5 | 5 |
| N-(3-Dimethylaminopropyl)acrylamide | 20 | — | 20 | 20 | 20 |
| Acrylic acid | — | 20 | — | — | — |
| (4) Photopolymerization initiator (part by wt.) | | | | | |
| 2,2-Dimethoxyphenylacetophenone | 1 | 1 | 1 | 1 | 1 |
| Other components (part by wt.) | | | | | |
| p-t-Butylcatechol | 0.5 | 0.5 | 0.5 | 0.5 | 0.5 |
| JSR SIS5000 (*) | — | — | — | — | 30 |
| Evaluation | | | | | |
| Time required for dissolution (sec) | 130 | 140 | 120 | 110 | 280 |
| Tensile strength (kgf/cm$_2$) | 33 | 29 | 31 | 36 | 24 |
| Elongation at break (%) | 120 | 125 | 115 | 130 | 105 |
| Impact resilience | 35 | 33 | 34 | 33 | 30 |

Note:
(*) Styrene-isoprene type thermoplastic elastomer manufactured by JSR Co., Ltd.

The water-developable photosensitive resin composition of this invention is small in swelling with water, excellent in water-developability and impact resilience, also excellent in resin plate strength and elongation at break and, in addition, good in transparency of resin plate when the component (2) is the block-like copolymer (i). Moreover, when the component (2) is the block-like copolymer (ii), the composition is excellent in both water-developability and resin plate strength after exposure, good in elongation at break and impact resilience and also good in transparency of resin plate and had an excellent characteristics balance. In addition, the composition of this invention can be freely designed so as to have properties of from a fluidity-free, waxy or rubbery state to a low viscosity liquid having an excellent fluidity, and is excellent in processability. Moreover, when the component (2) is the ethylene-α-olefin copolymer (III), the composition is small in swelling with water, excellent in water-developability and impact resilience, low in hardness and also good in transparency of resin plate and has an excellent characteristics balance. In addition, in all the above cases, the composition can be freely designed so as to have properties over a range of from a fluidity-free waxy or rubbery state to a low viscosity liquid having excellent fluidity and is good in processability.

Accordingly, the water-developable photosensitive resin composition of this invention can be very suitably used as a photoresist material and a photosensitive printing plate, and in addition, is useful as a photosensitive material in a broad technical field including photosensitive ink, photosensitive paint, photosensitive adhesive, photomolding material and the like.

What is claimed is:

1. A water-developable photosensitive resin composition which comprises:

(1) a particulate copolymer made by polymerizing monomers comprising:

(a) 10 to 95 mole % of an aliphatic conjugated diene,
(b) 0.1 to 30 mole % of a monomer having one polymerizable unsaturated group and at least one functional group selected from the group consisting of carboxyl group, amino group, hydroxyl group, epoxy group, sulfonic acid group and phosphoric acid group, and
(c) 0.1 to 20 mole % of a monomer having at least two polymerizable unsaturated groups;

(2) at least one copolymer selected from the group consisting of:

(i) a block copolymer composed of two or more polymeric segments and having a sulfonic acid group in at least one of the polymeric segments, wherein the sulfonic acid group content is 0.5 to 6.0 millimoles/g in terms of $SO_3H$, the block copolymer being made by (A) a method which comprises sulfonating the polymeric segment having a carbon-to-carbon double bond in the polymer side chain and/or the polymer main chain with a sulfonating agent, or by (B) a method for copolymerizing a sulfonic acid group-containing monomer component with a monomer component other than the sulfonic acid group-containing monomer component,
(ii) a block copolymer composed of two or more polymeric segments and having a polyurethane segment in at least one of the polymeric segments, and
(iii) a copolymer of ethylene and an α-olefin having 3 to 20 carbon atoms;

(3) a photopolymerizable unsaturated compound; and
(4) a photopolymerization initiator.

2. The water-developable photosensitive resin composition according to claim 1, wherein the monomer (b) of the particulate copolymer (1) has at least one functional group selected from the group consisting of carboxyl group, amino group, hydroxyl group and sulfonic acid group.

3. The water-developable photosensitive resin composition according to claim 1, wherein the component (2) is the block copolymer (i) composed of two or more polymeric segments and having a sulfonic acid group in at least one of the polymeric segments.

4. The water-developable photosensitive resin composition according to claim 3, wherein the block copolymer (i) is a block copolymer obtained from at least one monomer selected from the group consisting of a vinyl aromatic compound, an aliphatic conjugated diene compound and a (meth)acrylic ester compound.

5. The water-developable photosensitive resin composition according to claim 3, wherein the block copolymer (i) comprises, as the constitutive polymeric segments, a polymeric segment, at least 50% by weight of the constitutive monomer components of which consist of vinyl aromatic compounds, and another polymeric segment, at least 50% by weight of the constitutive monomer components of which consist of aliphatic conjugated diene compounds.

6. The water-developable photosensitive resin composition according to claim 5, wherein the other polymeric segment is sulfonated in its constitutive portion of the aliphatic conjugated diene compounds.

7. The water-developable photosensitive resin composition according to claim 1, wherein the component (2) is the block copolymer (ii) composed of two or more polymeric segment and having a polyurethane segment in at least one of the polymeric segments.

8. The water-developable photosensitive resin composition according to claim 7, wherein the block copolymer (ii) is a block copolymer comprising a polymeric segment selected from the group consisting of polyurea and non-polyether polyurethane and a polymeric segment selected from the group consisting of polyether polyurethane, dimethylpolysiloxane, vinyl block polymer, conjugated diene block polymer, and vinyl-conjugated diene block copolymer.

9. The water-developable photosensitive resin composition according to claim 7, wherein the block copolymer (ii) is a block copolymer comprising at least one polymeric segment represented by the general formula (I):

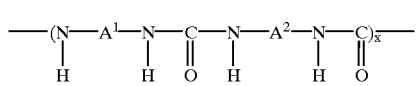

(I)

wherein each of $A^1$ and $A^2$ represents independently a divalent group derived from a compound selected from the group consisting of alkanes having 1 to 12 carbon atoms, benzene, methylbenzene, dimethylbenzene, naphthalene, diphenyl, dimethyldiphenyl, dimethoxydiphenyl, diphenylmethane, dimethyldiphenylmethane, cyclohexane, isophorone and dicyclohexylmethane, and X is an integer of 2 to 100, or the general formula (II):

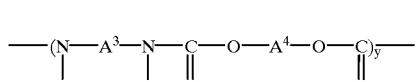

(II)

wherein each of $A^3$ and $A^4$ represents independently a divalent group derived from a compound selected from the group consisting of alkanes having 1 to 12 carbon atoms, benzene, methylbenzene, dimethylbenzene, naphthalene, diphenyl, dimethyldiphenyl, dimethoxydiphenyl, diphenylmethane, dimethyldiphenylmethane, cyclohexane, isophorone and dicyclohexylmethane and Y is an integer of 2 to 100; and at least one polymeric segment represented by the general formula (III):

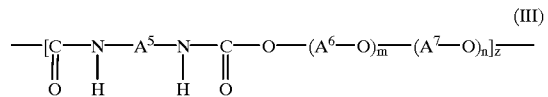

(III)

wherein $A^5$ represents a divalent group derived from a compound selected from the group consisting of alkanes having 1 to 12 carbon atoms, benzene, methylbenzene, dimethylbenzene, naphthalene, diphenyl, dimethyldiphenyl, dimethoxydiphenyl, diphenylmethane, dimethyldiphenylmethane, cyclohexane, isophorone and dicyclohexylmethane; $A^6$ represents a divalent group derived from a compound selected from the group consisting of alkanes having 1 to 12 carbon atoms, halogenated alkanes having 1 to 12 carbon atoms, benzene, methylbenzene, dimethylbenzene, naphthalene, diphenyl, dimethyldiphenyl, dimethoxydiphenyl, diphenylmethane, dimethyldiphenylmethane, cyclohexane, isophorone and dicyclohexylmethane, or a group represented by the formula —$A^8$—CO— in which $A^8$ represents an alkylene group having 1 to 12 carbon atoms; $A^7$ represents a divalent group derived from a compound selected from the group consisting of alkanes having 1 to 12 carbon atoms, halogenated alkanes having 1 to 12 carbon atoms, benzene, methylbenzene, dimethylbenzene, naphthalene, diphenyl, dimethyldiphenyl, dimethoxydiphenyl, diphenylmethane, dimethyldiphenylmethane, cyclohexane, isophorone and dicyclohexylmethane, or a group represented by the formula —$A^8$—CO— in which $A^8$ represents an alkylene group having 1 to 12 carbon atoms or by the formula —NH—$A^9$—CO— in which $A^9$ represents an alkylene group having 1 to 12 carbon atoms; m is an integer of 1 to 100; n is integer of 0 to 100, provided m+n≧2; and Z is an integer of 1 to 100, or the general formula (IV):

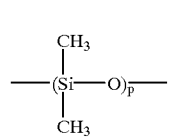

(IV)

wherein p is an integer of 2 to 100, or the general formula (V):

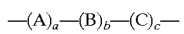

(V)

wherein A represents the residue of a vinyl aromatic compound, B represents the residue of an aliphatic conjugated diene compound, C represents the residue of a (meth) acrylic ester compound or another copolymerizable vinyl compound, and each of a, b and c represents independently an integer of 0 to 1,000,000, provided 2≦a+b+c≦3,000,000.

10. The water-developable photosensitive resin composition according to claim 9, wherein the block-like copolymer (ii) is a block copolymer comprising at least one polymeric segment represented by the above general formula (I) or the above general formula (II) and at least one polymeric segment represented by the above general formula (III) or the above general formula (V).

11. The water-developable photosensitive resin composition according to claim 1, wherein the copolymer (2) is a copolymer (iii) of ethylene and an α-olefin having 3 to 20 carbon atoms.

12. The water-developable photosensitive resin composition according to claim 11, wherein the copolymer (iii) has an ethylene content of 60 to 95 mole % of the total amount of the ethylene unit and the α-olefin unit and has an α-olefin content of 5 to 40 mole % of the total amount of the ethylene unit and the α-olefin unit.

13. The water-developable photosensitive resin composition according to claim 1, wherein, per 100 parts by weight of the particulate copolymer (1), the amount of the copolymer (2) is 1 to 500 parts by weight, the amount of the photopolymerizable unsaturated compound (3) is 5 to 1,000 parts by weight and the amount of the photopolymerization initiator (4) is 0.1 to 20 parts by weight.

14. A flexographic resin plate consisting of a supporting material and a film of the photosensitive resin composition according to claim 1 formed on the supporting material.

15. The water-developable photosensitive resin composition according to claim 1, wherein the sulfonating agent is selected from the group consisting of sulfuric anhydride, fuming sulfuric acid, chlorosulfonic acid and sodium hydrogensulfite.

16. The water-developable photosensitive resin composition according to claim 1, wherein the sulfonic acid group-containing monomer component is selected from the group consisting of a vinyl group-containing sulfonic acid, a (meth)allyl group-containing sulfonic acid, a (meth)acryloyl group-containing sulfonic acid and salts thereof.

* * * * *